United States Patent
Asano et al.

(10) Patent No.: US 7,928,515 B2
(45) Date of Patent: Apr. 19, 2011

(54) SEMICONDUCTOR DEVICE AND MANUFACTURING METHOD OF THE SEMICONDUCTOR DEVICE

(75) Inventors: Masayoshi Asano, Kawasaki (JP); Yoshiyuki Suzuki, Kawasaki (JP); Tetsuya Ito, Kawasaki (JP); Hajime Wada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 152 days.

(21) Appl. No.: 12/136,955

(22) Filed: Jun. 11, 2008

(65) Prior Publication Data

US 2008/0315319 A1 Dec. 25, 2008

Related U.S. Application Data

(63) Continuation of application No. PCT/JP2005/022793, filed on Dec. 12, 2005.

(51) Int. Cl.
*H01L 29/00* (2006.01)

(52) U.S. Cl. ... 257/377; 257/378; 257/381; 257/E21.09; 438/383

(58) Field of Classification Search ........ 257/296, 257/377, E29.001, E21.09, 378, 379, 381; 438/383

See application file for complete search history.

(56) References Cited

U.S. PATENT DOCUMENTS

| | | | |
|---|---|---|---|
| 5,049,959 A * | 9/1991 | Satoh | |
| 6,785,157 B2 * | 8/2004 | Arimoto et al. | |
| 7,208,369 B2 * | 4/2007 | Pai et al. | 438/241 |
| 2002/0196690 A1 * | 12/2002 | Matsumoto | |

FOREIGN PATENT DOCUMENTS

| | | | |
|---|---|---|---|
| JP | 54-121080 A | | 9/1979 |
| JP | 60-220958 A | | 11/1985 |
| JP | 62-293667 A | * | 12/1987 |
| JP | 63-308367 A | | 12/1988 |
| JP | 1-191465 A | | 8/1989 |
| JP | 11-307737 A | | 11/1999 |
| JP | 2000-114458 A | | 4/2000 |
| JP | 2000-339963 A | * | 12/2000 |
| JP | 2001-320016 A | | 11/2001 |
| JP | 2003-92364 A | | 3/2003 |
| JP | 2005-51045 A | | 2/2005 |

OTHER PUBLICATIONS

International Search Report of PCT/JP2005/022793, date of mailing Mar. 14, 2006.

* cited by examiner

*Primary Examiner* — Thinh T Nguyen

(74) *Attorney, Agent, or Firm* — Fujitsu Patent Center

(57) ABSTRACT

A semiconductor device includes a dual gate CMOS logic circuit having gate electrodes with different conducting types and a trench capacitor type memory on a same substrate includes a trench of the substrate for the trench capacitor, a dielectric film formed in the trench, a first poly silicon film formed inside of the trench, and a cell plate electrode located above the dielectric film. The cell plate electrode includes a first poly silicon film formed on the dielectric film partially filling the trench, and a second poly silicon film formed on the first poly silicon film to completely fill the trench. The second poly silicon film includes a sufficient film thickness for forming gate electrodes, wherein the impurity concentration of the first poly silicon film is higher than the impurity concentration of the second poly silicon film.

4 Claims, 28 Drawing Sheets

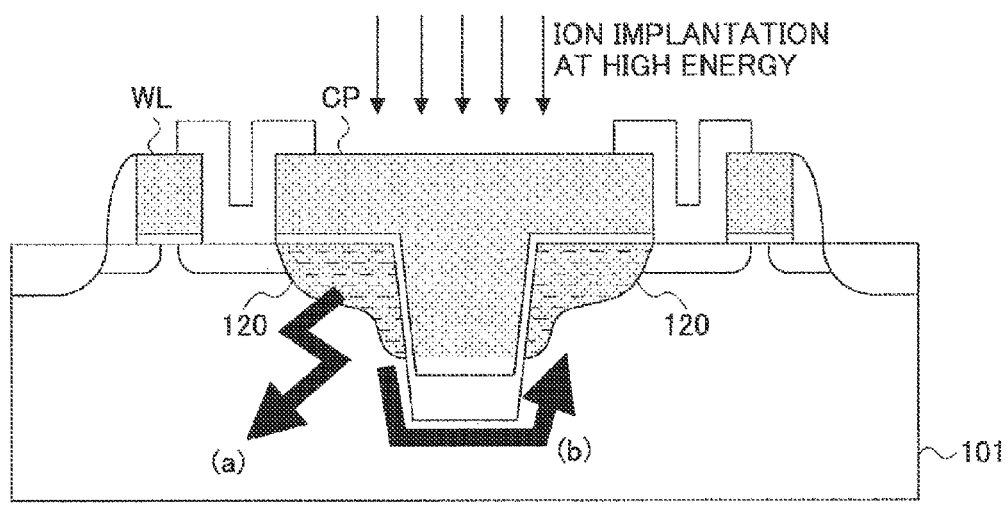

FIG.4
RELATED ART
(a) WHEN FORMING HIGH RESISTANCE ELEMENT WITH LOW RESISTIVITY MATERIAL
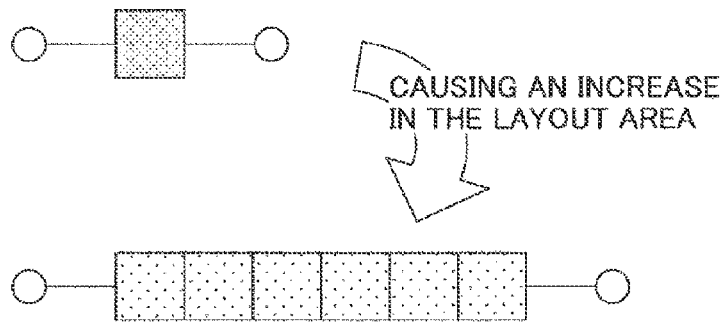
(b) WHEN FORMING LOW RESISTANCE ELEMENT WITH HIGH RESISTIVITY MATERIAL
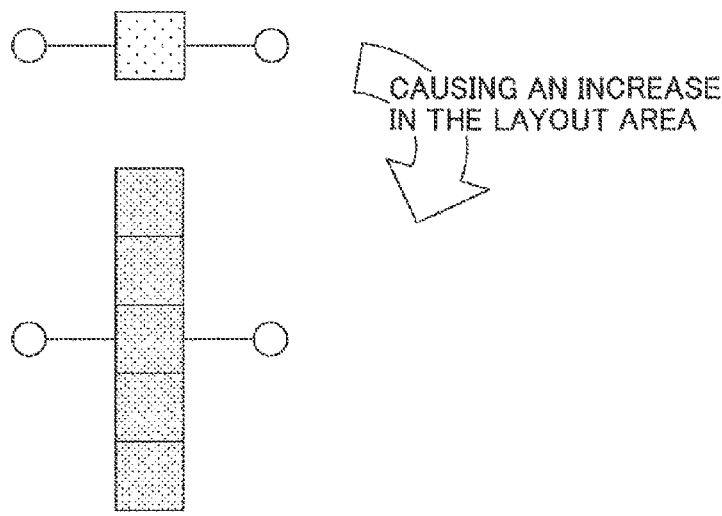
 WHEN A RESISTANCE PAR A UNIT AREA IS HIGH
 WHEN A RESISTANCE PAR A UNIT AREA IS LOW

FIG.7B

|  | ION IMPLANTATION FOR THIN FILM POLY SILICON (15a) | ION IMPLANTATION FOR THICK FILM POLY SILICON (15b) (MAY BE COMMON WITH SOURCE-DRAIN ION IMPLANTATION) |
|---|---|---|
| 1) POLY SILICON RESISTOR 1: | ION IMPLANTATION | ION IMPLANTATION |
| 2) POLY SILICON RESISTOR 2: | NON ION IMPLANTATION | ION IMPLANTATION |
| 3) POLY SILICON RESISTOR 3: | ION IMPLANTATION | NON ION IMPLANTATION |
| 4) POLY SILICON RESISTOR 4: | NON ION IMPLANTATION | NON ION IMPLANTATION |

FIG.8A

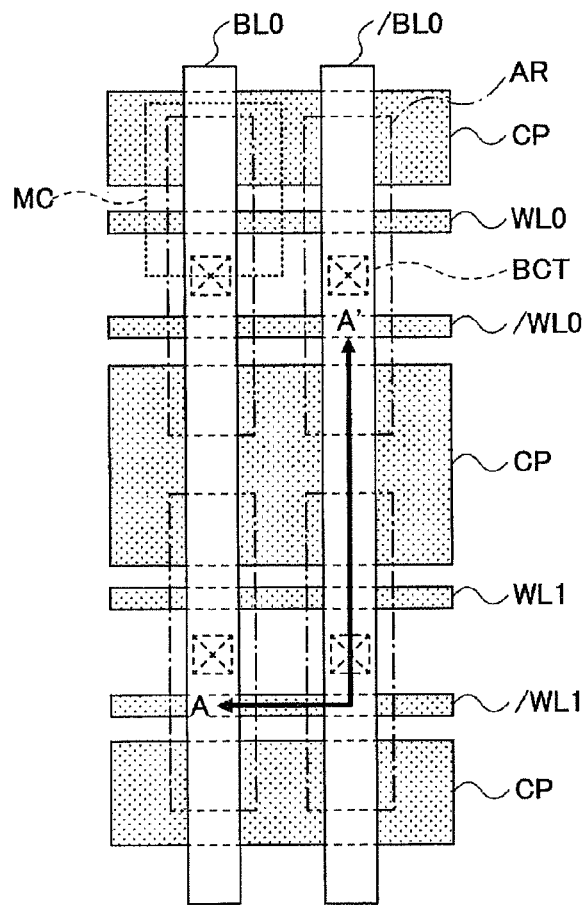

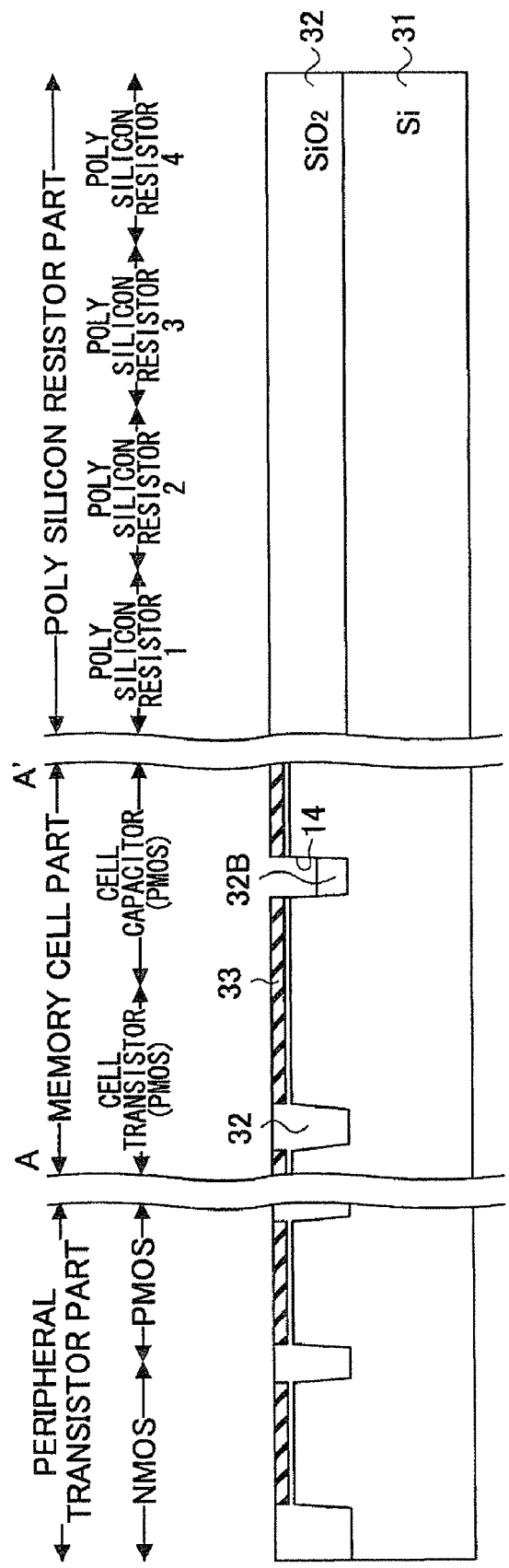

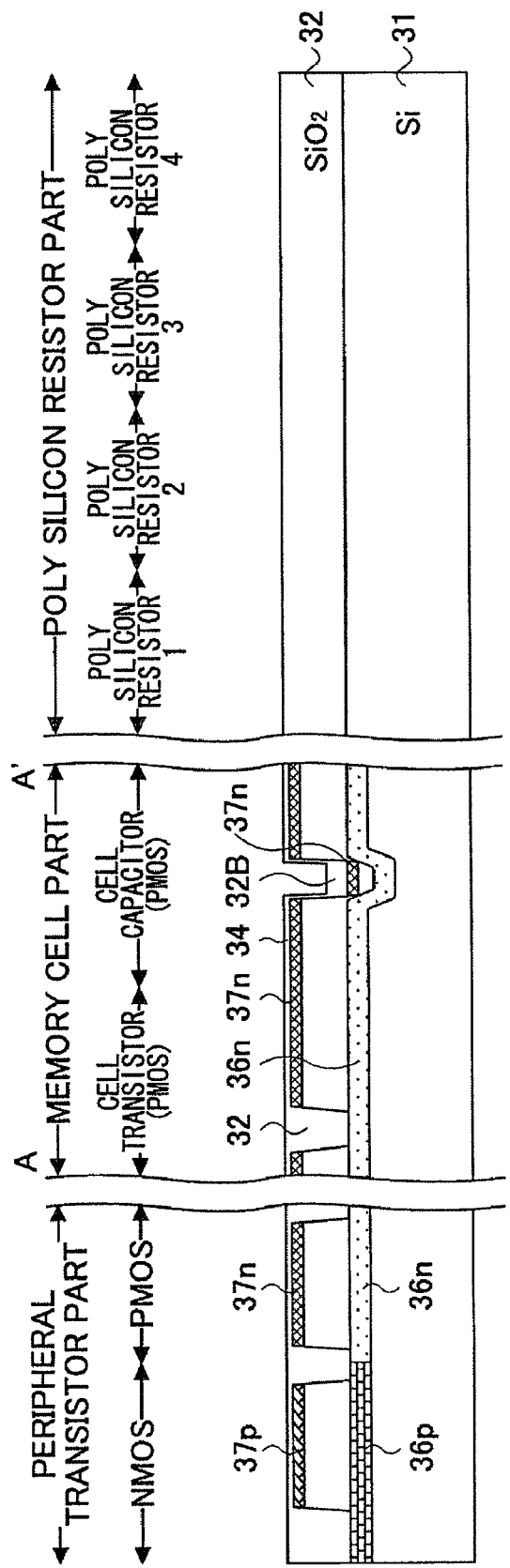

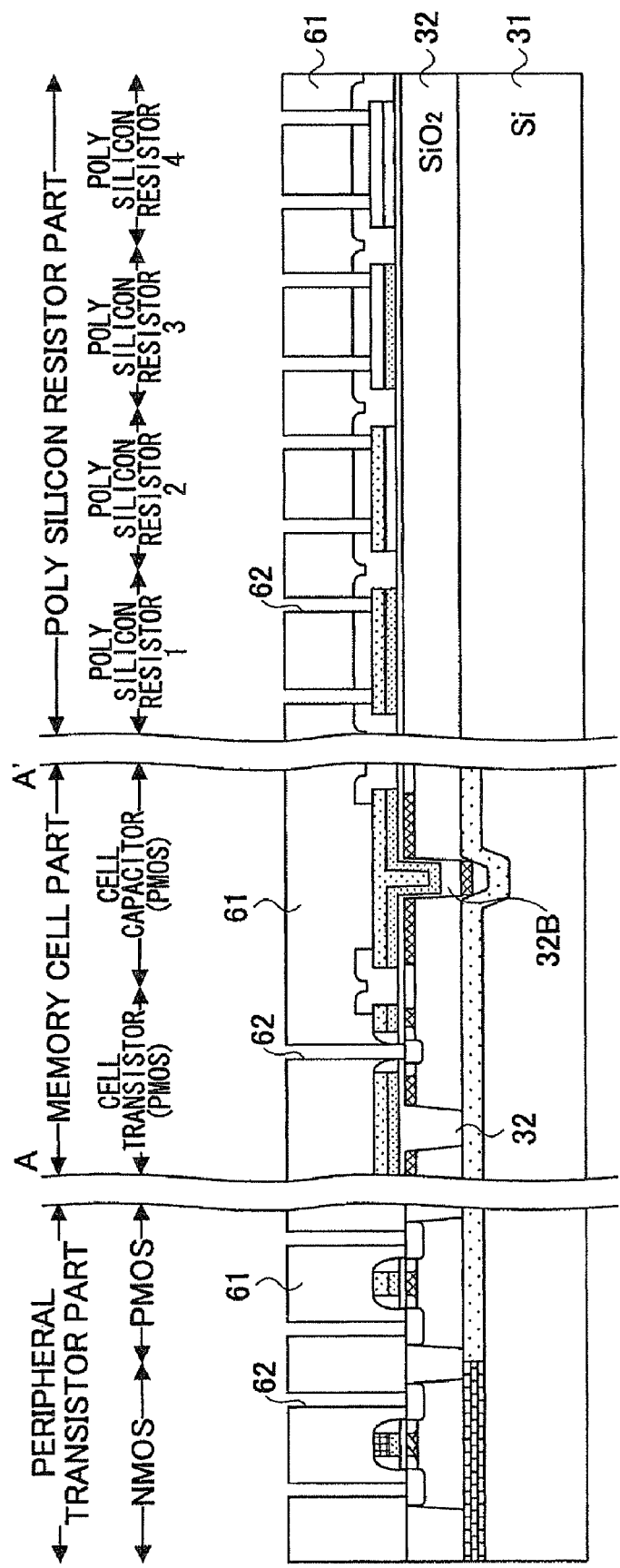

FIG.10A
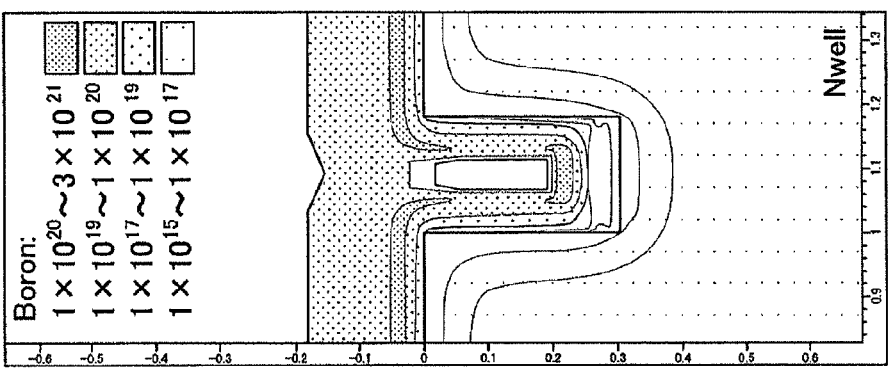
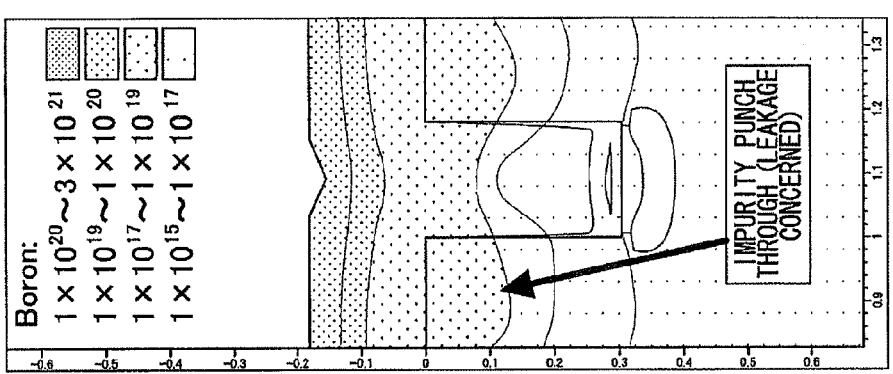
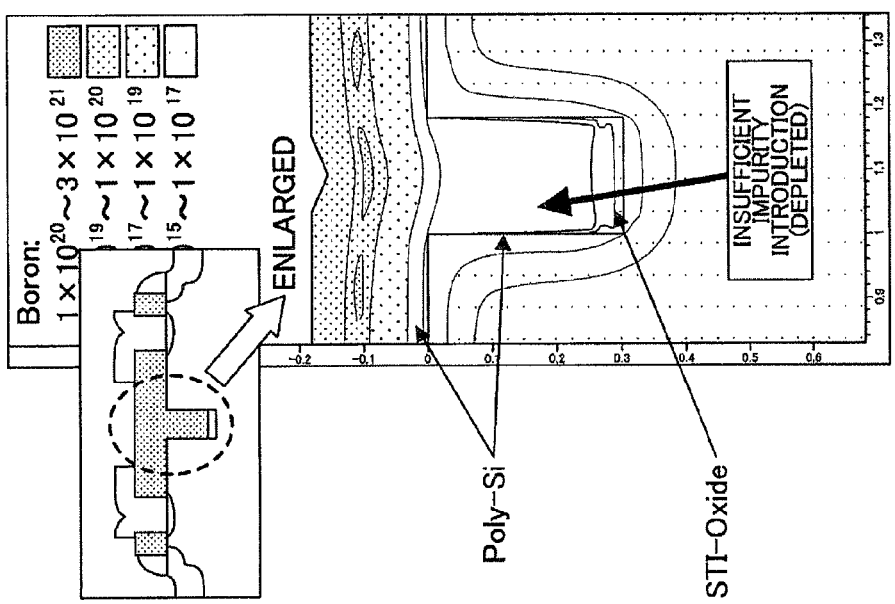

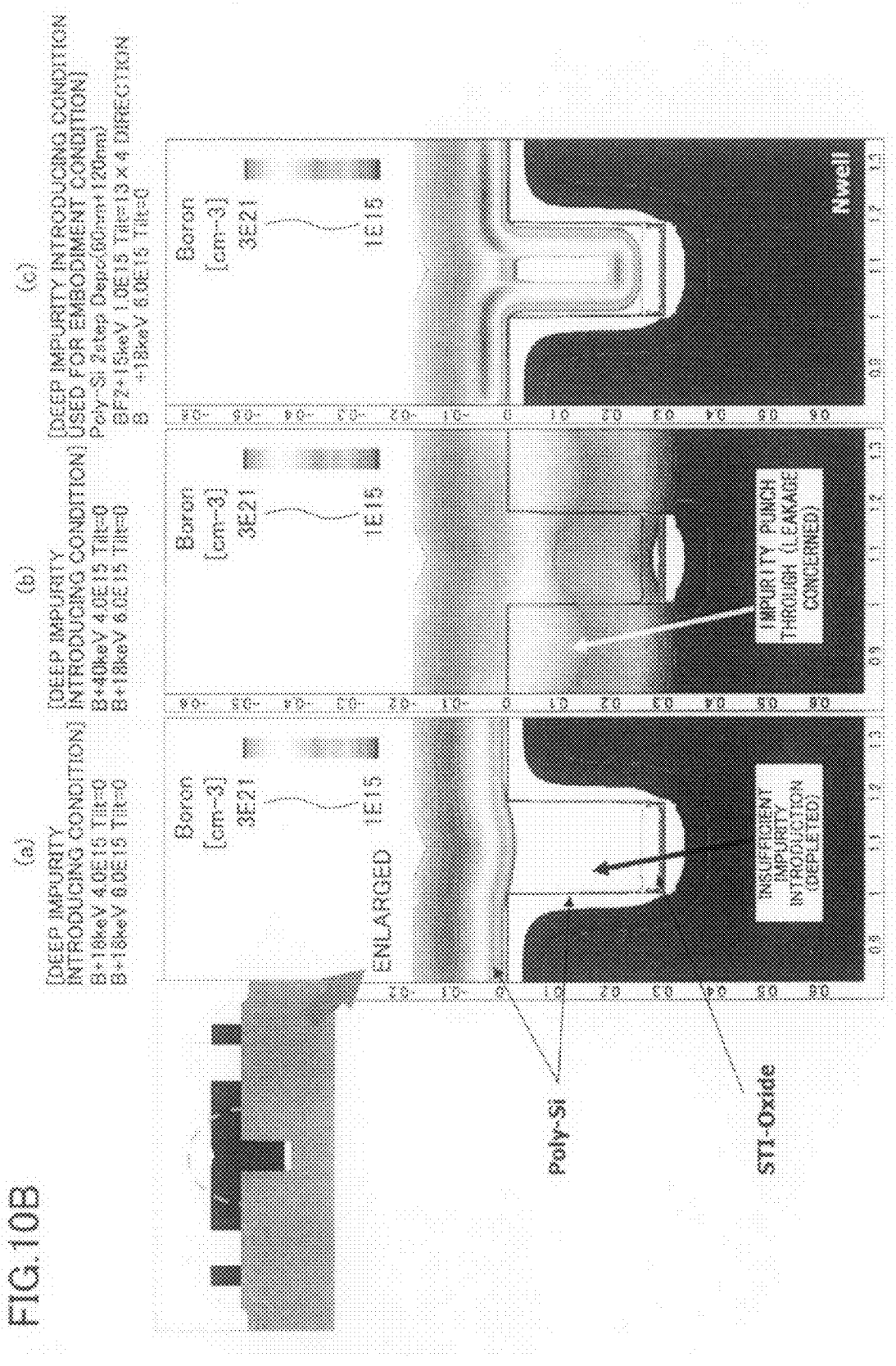

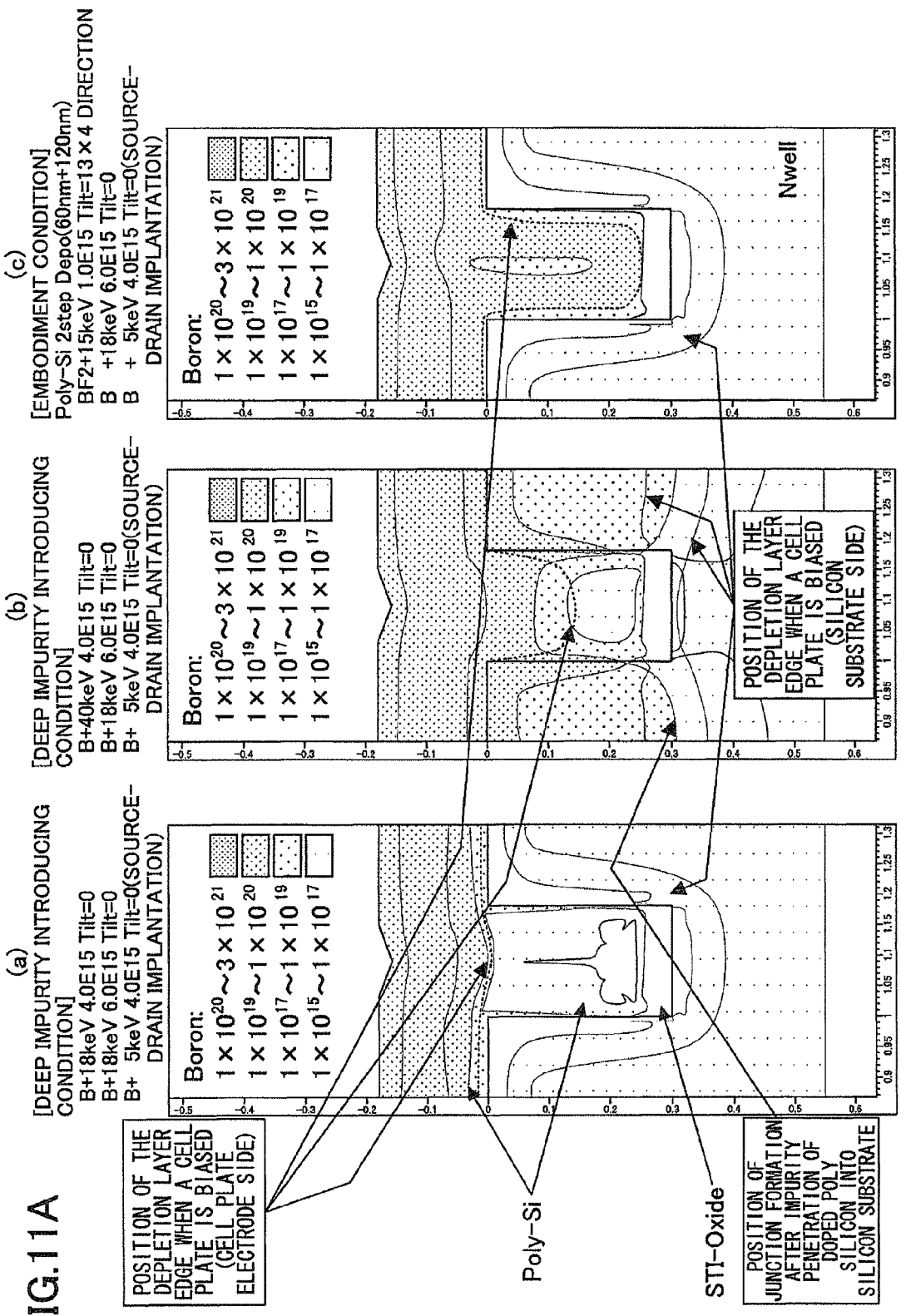

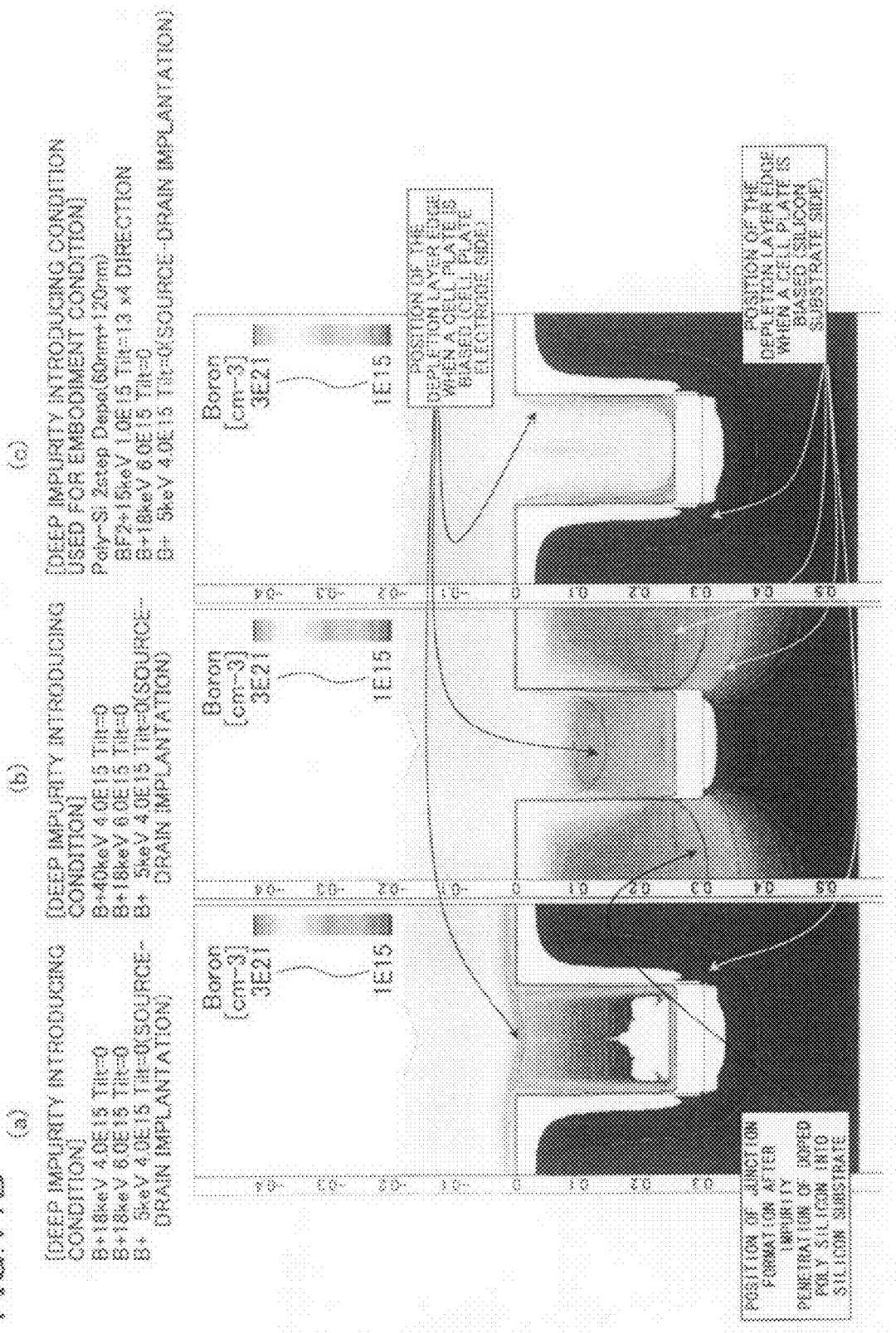

<TABLE OF ION IMPLANTATION CONDITIONS>

| | ION IMPLANTATION AFTER FORMING THIN POLY SILICON FILM | ION IMPLANTATION AFTER FORMING THICK POLY SILICON FILM | ADJUSTING ION IMPLANTATION FOR HIGH RESISTANCE |
|---|---|---|---|
| | BF2+15keV 1.0E15 Tilt=13deg×4 TILT IMPLANTATION | B+13keV 6.0E15 Tilt=0deg | B+13keV 5.0E13 Tilt=0deg |
| POLY SILICON 1 | ION IMPLANTATION | ION IMPLANTATION | ION IMPLANTATION |
| POLY SILICON 2 | NON ION IMPLANTATION | ION IMPLANTATION | ION IMPLANTATION |
| POLY SILICON 3 | ION IMPLANTATION | NON ION IMPLANTATION | ION IMPLANTATION |
| POLY SILICON 4 | NON ION IMPLANTATION | NON ION IMPLANTATION | ION IMPLANTATION |

(b)

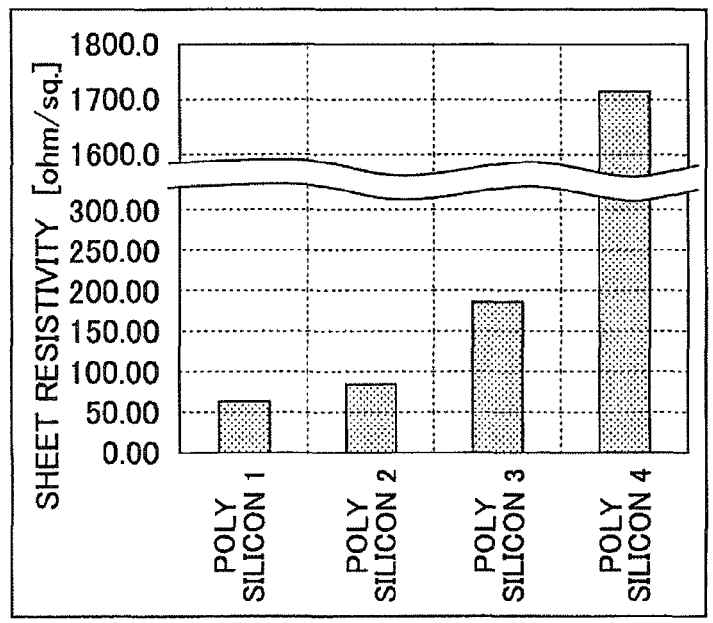

<SIMULATION RESULT>

SEMICONDUCTOR DEVICE AND MANUFACTURING METHOD OF THE SEMICONDUCTOR DEVICE

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2005/022793 filed Dec. 12, 2005, in the Japanese Patent Office, the disclosure of which is hereby incorporated by reference.

BACKGROUND

1. Field

The embodiments discussed herein are directed to semiconductor devices and manufacturing methods of semiconductor devices, which may have trench capacitors, in which the semiconductor devices include CMOS logic circuits and one transistor-one capacitor type memory cells formed on the same substrate, and the memory cells utilize side walls of shallow trench isolation (STI) for memory capacitors and a manufacturing method of the semiconductor device.

2. Description of the Related Art

For semiconductor memories that include memory cells to store data in capacitors, trench capacitor type semiconductor memories are proposed for reducing the cell area and increasing integration of the semiconductor devices, in which shallow trench isolation (STI) is used for capacitors formed by using side walls of the trenches, and insulating films on the bottom of the STI trenches isolate adjacent memory cells (see Patent Reference 1).

A conventional trench capacitor includes a cell plate provided on a dielectric film formed on a side wall of a trench and a semiconductor substrate, in which an impurity diffusion layer is provided on a surface side of a silicon substrate located between a transfer transistor and the cell plate electrode. The capacitor connected to the source-drain diffusion region of the transfer transistor is formed by applying a bias voltage to the cell plate electrode to invert a channel of the substrate surface.

For further increase in integration of semiconductor memory devices, the width of device isolation (STI: shallow trench isolation) is predicted to be narrowed in the future. A size reduced device structure may be provided with trenches that are fully filled with cell plate electrodes.

FIG. 1 shows a trench capacitor type memory cell with size reduction. For this memory cell, an inversion layer 105 is formed by applying a bias to a cell plate (CP) electrode 106 from the surface of a silicon substrate 101 toward a side wall of the trench 102. A buried insulating film 103 located on the bottom of the trench 102 isolates a memory cell from an adjacent memory cell. The inversion layer 105 is connected to one end of LDD (lightly doped drain or extension) impurity diffusion region 108 extended toward one end of a word line (WL) 107, and forms a storage node of a capacitor. A source-drain impurity diffusion region 109 is connected to an upper bit line through a bit line contact (not shown).

In general, when an impurity concentration of the cell plate electrode 106 is low, a depletion layer expands from the interface between the dielectric film 103 and the cell plate electrode 106 to an inner part of the cell plate electrode 106 when a bias is applied, and this prevents forming an inversion layer and decreases the effective capacitance of the capacitor. The impurity concentration of the cell plate electrode 106 is preferred to be designed high enough to prevent forming the depletion layer when being biased.

However, for a configuration where the cell plate electrode 106 fills the trench 102 (STI), the impurity concentration at a deep region of the STI trench 102 becomes lower when ion implantation energy for introducing impurities into the cell plate electrode 106 is not high enough. This results in forming a depletion region A at an inner part of the cell plate electrode 106, so that a channel region is not easily inverted and the effective capacitance of the capacitor is reduced. As a result, it becomes a problem that a predetermined capacitance characteristic (data storage characteristics) is not obtained.

For this problem, there are possible solutions as follow:
(A) Thinning the cell plate electrode
(B) Increasing the energy of impurity implantation
(C) Introducing impurities during the cell plate electrode formation However, each solution above causes an increase in manufacturing steps, degradation of periphery transistor characteristics, and increase in leakage currents.

FIG. 2A shows a drawback related to thinning the cell plate electrode 106 (A). When the cell plate electrode 106 is thinned, the gate electrodes (word line: WL) of the periphery transistors become thinner. This is because, in general, the cell plate electrodes and the gate electrodes (or word line) of periphery transistors are formed in the same process step. When the gate electrode is formed thin, the ion implantation of a source-drain (SD) diffusion layer using the gate electrode needs to be shallow. This may cause degradation of periphery transistors. When a resistor is formed with the same layer as the gate electrode layer of the periphery transistors, the resistance of the resistor becomes high (not shown).

To avoid this drawback, the cell plate electrode (CP) may be formed separately from the gate electrodes (WL) of the periphery transistors. However, the number of the fabrication steps increases, which increases process difficulty of the fabrication.

FIG. 2B shows a problem related to method (B) of increasing ion implantation energy. When the implantation energy is increased, impurity penetration (arrow (a)) may occur underneath the gate electrodes (WL) of the periphery transistors. This may cause an increase in a junction leakage current and an increase in field leakage currents between adjacent capacitors.

When the ion implantation is performed for a trench capacitor part and a transistor gate part by using different resist patterns, the number of fabrication steps is increased. Further, margins need to be provided for the alignment of the resist patterning. This may induce impurity penetration. As a result, an unnecessary diffusion layer 120 is formed around side walls of the trench, which causes an increase in the leakage currents (arrow (b)) between the adjacent cells and degrades the field leakage characteristics.

FIG. 3 shows a matter of concern for the impurity doping during the cell plate electrode formation. A method (C) of doping impurities during film formation is known (e.g. Patent References 2, 3, and 4). However, the cell plate electrodes and the periphery transistors are formed in the same process. That does not allow providing different gates for the periphery transistors, and this limits the performance of the periphery transistors. For providing different gates for periphery transistors as shown in FIG. 3, for example, the forming steps of cell plate electrodes and gates of periphery transistors may be separated, however, difficulties arise.

First, the manufacturing cost would increase because the fabrication steps are complicated. As shown in FIG. 3(a), a gate oxide film 130 is formed on a silicon substrate 101, on which an n+-doped silicon film 131 is formed. In FIG. 3(b), a gate electrode 132 of an NMOS (n-type metal oxide semiconductor) transistor is formed by an etching process, and an n−-LDD 138 (n-type lightly doped drain) is formed only on the NMOS region by ion implantation. In this step, a gate oxide film 130 of a PMOS (p-type metal oxide semiconductor) transistor is exposed during the etching process, which may reduce reliability of PMOS transistors to damage due to over-etching of the etching process. In the next step, a p+-doped silicon film 133 is formed as shown in FIG. 3(c), and the impurities in LDD 138 of the NMOS region diffuse during the formation of p+-doped silicon film 133, which makes it difficult to maintain shallow junctions of the LDD 138 and may cause degradation of devices.

Further, as shown in FIG. 3(d), a PMOS gate electrode 134 is formed by the etching process, and impurities of a p−-LDD 139 are implanted onto only the PMOS transistor regions. In this step, part of the p+-doped silicon film 135 is left on the side walls of the gate electrode 132. As a result, the actual size of the NMOS gate electrode becomes longer, which makes the transistor area and the layout area larger. On the other hand, n+ source-drain diffusion region (SD) 140 is formed by using the p+-doped poly silicon film 135 as a mask. The distance between LDD 138 and SD 140 is limited by the thickness of the p+-doped poly silicon film 135. This distance increases the resistance, which becomes a disadvantage for high performance of the device. However, when the p+-doped poly silicon film 135 is formed to be thinner, the impurity implantation of SD 140 at the NMOS region cannot be formed deeply, which degrades the device performance.

As a final step, side walls 136 are formed, and followed by p+ source-drain regions (SD) 141 formation in PMOS regions.

As discussed above, the conventional process of introducing impurities during cell plate electrode film formation includes the complexity of the fabrication process and difficulty in applying the process to dual gate devices.

Without the electrode formation discussed above, there is another issue that requires reducing layout areas of resistors with size reduction of devices. Most peripheral circuits of memory cell drivers, logic circuits, and analog circuits include resistors, and individual circuits require different resistances of their resistors. For example, small current circuits require high-resistance resistors and fast operation circuits require low-resistance resistors.

In general, resistor elements are formed by implanting impurities into a poly silicon film or a silicon substrate. When the number of types of resistor elements (resistivity per unit area) is limited, a high resistance resistor may be formed with low resistivity resistor elements, and a low resistance resistor may be designed by using high-resistivity resistor elements. Thereby, the layout area is increased, as shown in FIG. 4.

As indicated in FIG. 4(a), when a high resistance resistor element is designed by using low-resistivity resistor elements, the layout area is increased as plural low-resistivity elements need to be connected in series. Likewise, when a low resistance element is designed by using plural resistance elements with high resistivity, the units need to be connected in parallel, so that the layout area is increased as shown in FIG. 4(b). Although it is preferred that plural types of resistor elements be built on a single substrate, additional fabrication processes are necessary for fabricating such resistor elements.

Patent Reference 1: Japanese Patent Application Publication No. 2003-92364
Patent Reference 2: Japanese Patent Application Publication No. 11-307737
Patent Reference 3: Japanese Patent Application Publication No. 2000-114458
Patent Reference 4: Japanese Patent Application Publication No. 2005-51045

SUMMARY

It is an aspect of the embodiments discussed herein to provide a semiconductor device including a dual gate CMOS logic circuit having gate electrodes with different conducting types and a trench capacitor type memory on a same substrate, the semiconductor device including: a trench of the substrate for the trench capacitor, a dielectric film formed in the trench, a first poly silicon film formed inside of the trench, and a cell plate electrode located above the dielectric film; wherein the cell plate electrode includes the first poly silicon film formed on the dielectric film to partially fill the trench, and a second poly silicon film formed on the first poly silicon film to completely fill the trench; wherein the second poly silicon film includes a sufficient film thickness for forming the gate electrodes; wherein an impurity concentration of the first poly silicon film in the trench of the cell plate electrode is higher than the impurity concentration of the second poly silicon film filled inside of trench of the cell plate electrode.

Other objects, features, and advantages of the present invention will become more apparent from the following detailed description when read in conjunction with the accompanying drawings.

BRIEF DESCRIPTION OF DRAWINGS

FIG. 2B shows an illustration for describing another problem when impurity implantation energy is increased for reducing the problem indicated of FIG. 1;

FIG. 4 shows a schematic illustration for describing an issue of increasing the layout area of resistor elements;

FIG. 7B is another illustration describing a fabrication method of plural types of resistor elements in a unit area;

FIG. 8A shows an example of memory cells layout;

FIG. 9B shows a schematic illustration of a semiconductor memory device fabrication process related to another embodiment;

FIG. 9D shows a schematic illustration of a semiconductor memory device fabrication process related to another embodiment;

FIG. 9L shows a schematic illustration of a semiconductor memory device fabrication process related to another embodiment;

FIG. 10A shows schematic illustrations comparing simulation results of two dimensional impurity profiles of different impurity introduction conditions, indicating an effect;

FIG. 10B shows simulation results of two dimensional impurity profiles after introducing impurities above;

FIG. 11A shows schematic illustrations comparing simulation results of two dimensional impurity profiles of different conditions after final thermal annealing, indicating an effect;

FIG. 11B shows simulation results of two dimensional impurity profiles after final thermal annealing above;

FIG. 13 shows schematic illustrations indicating simulation results of the relationship between sheet resistivity and ion implantation conditions for forming resistor elements with plural types of resistances according to an embodiment.

DETAILED DESCRIPTION OF THE PREFERRED EMBODIMENTS

In the following, preferable embodiments are described referring to FIG. 5A through FIG. 13.

FIGS. 5A-5D are figures to describe a basic configuration. In an embodiment, for a semiconductor memory device, the side walls of STI trenches may be used for capacitors, and a cell plate electrode includes a two-layer structure. Therefore, a first poly silicon film is formed that partially fills a trench, and a second poly silicon film is formed to maintain a predetermined film thickness for forming memory cell transistors and peripheral circuit transistors; that is, there is a two-step configuration of the first poly silicon and the second poly silicon film. The first poly silicon film in the trench includes a higher impurity concentration than that of the second poly silicon film. The second poly silicon may or may not include impurities.

Figure 1:
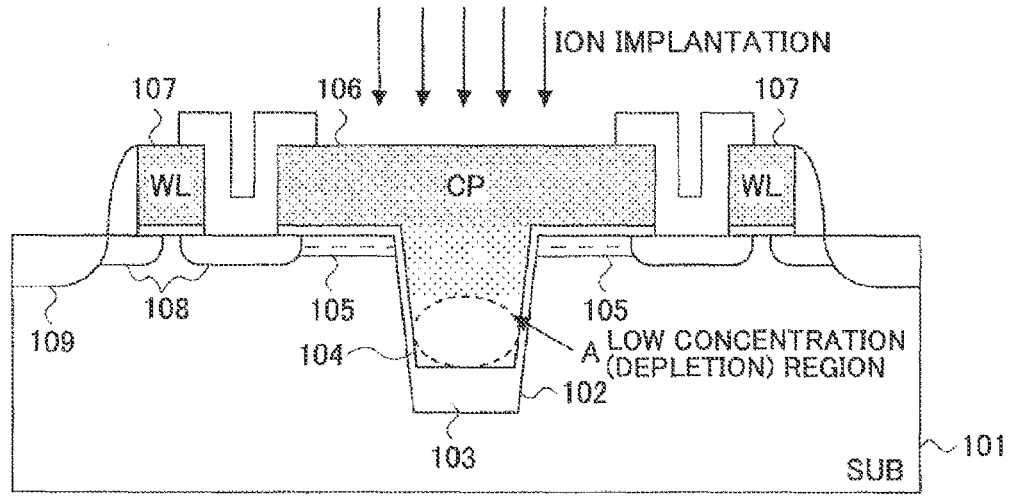
FIG. 1 shows a schematic illustration for describing a problem when trench type capacitor memory cells are downsized.
Figure 2A:
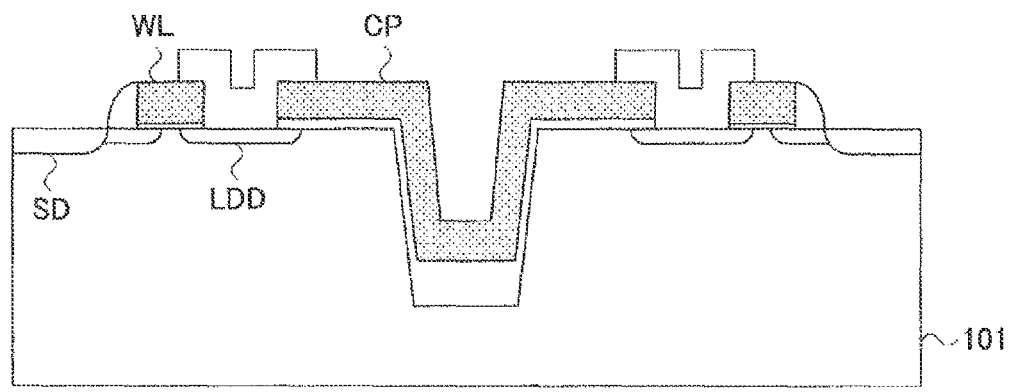
FIG. 2A shows an illustration for describing another problem when cell plate electrodes are thinned for solving the problem indicated in FIG. 1.
Figure 3:
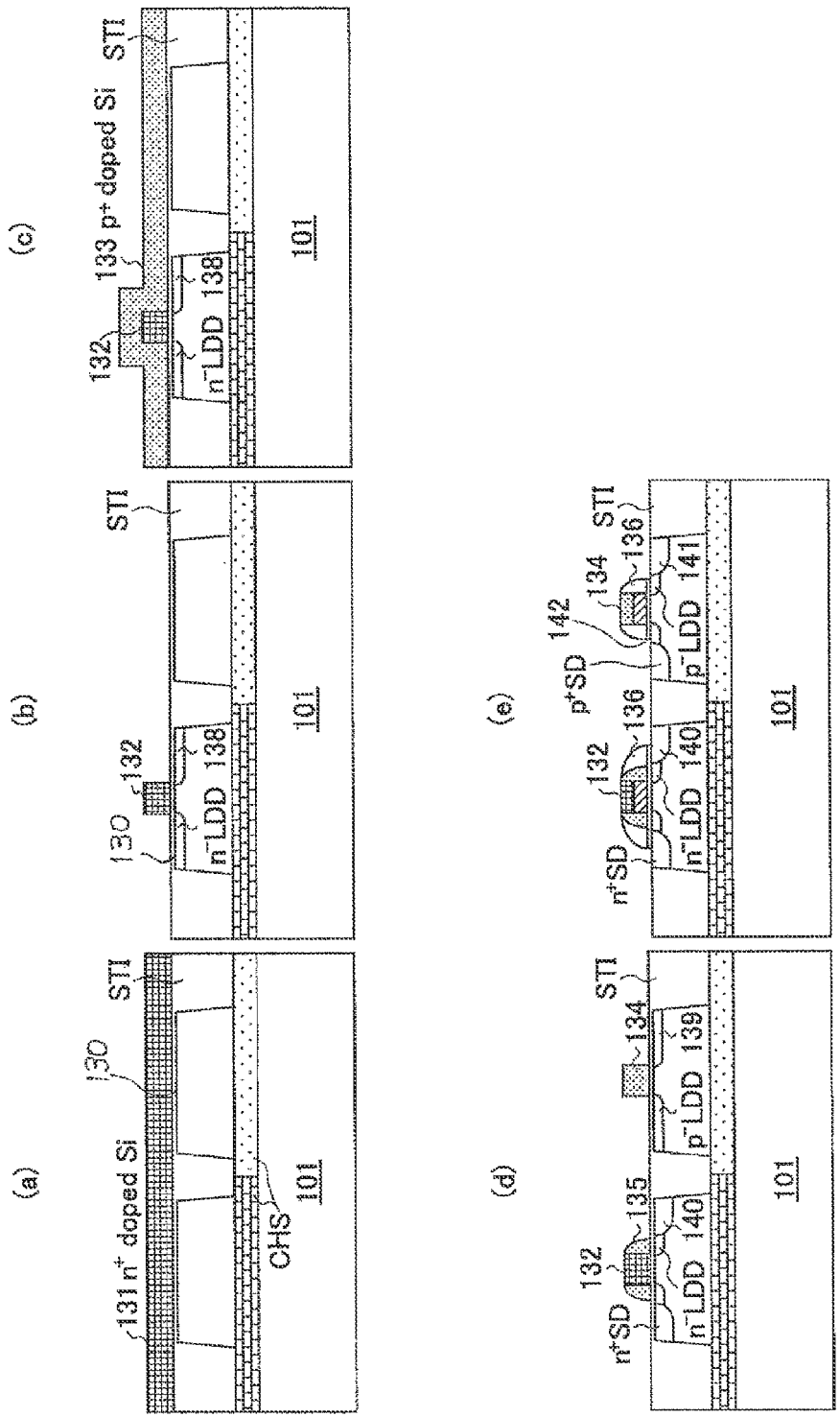
FIG. 3 shows an illustration for describing another problem when impurities are introduced during cell plate film formation for solving the problem indicated in FIG. 1.
Figure 5A:
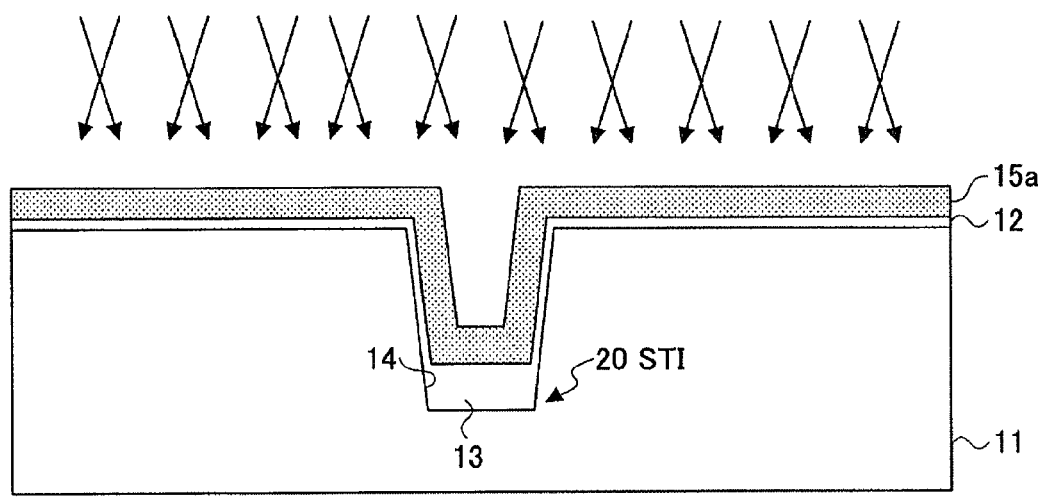
FIG. 5A shows an illustration for describing a basic configuration.

Specifically, as shown in FIG. 5A, a buried oxide film 13 for device isolation is provided on the bottom of a trench 14 formed on a silicon substrate 11. The whole substrate is covered with a thin silicon oxide film 12 and the first poly silicon film 15a is formed to partially fill the trench 14. The first poly silicon film 15a is defined as a thin poly silicon film. Impurities implanted into the first poly silicon film 15a are controlled not to penetrate through the first poly silicon film 15a by an oblique implantation technique with substrate rotation.

The ion implantation conditions are, for example, with energy of 15 keV with an impurity dosage of $1.0\times10^{15}$ cm$^{-2}$, boron fluoride (BF) is implanted at a substrate tilt angle of 13° while rotating the substrate in four directions (a total implantation dosage of $4.0\times10^{15}$ cm$^{-2}$).

Figure 5B:
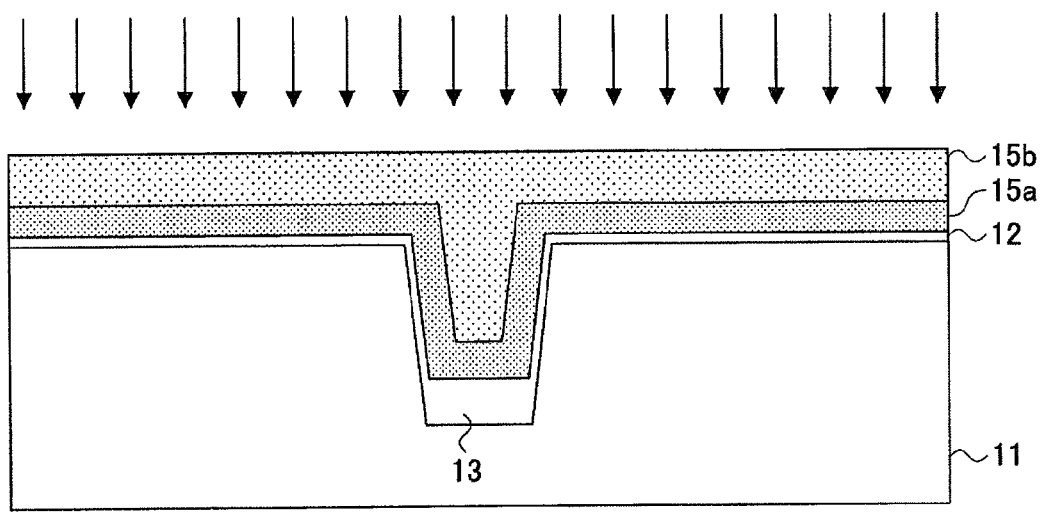
FIG. 5B shows another illustration for describing a basic configuration.

Next, as indicated in FIG. 5B, the second poly silicon film 15b is further grown on the first poly silicon film 15a to provide a film thickness required to provide gate electrodes of memory cell transistors and peripheral circuit transistors. The second poly silicon film 15b is a thick film. If necessary, impurities may be implanted into the second poly silicon film 15b. In such a case, the implantation conditions are, for example, with energy of 18 keV, by using boron (B) ions, with a dosage of $6.0\times10^{15}$ cm$^{-2}$ in a direction normal to the substrate. In this case, implantation energy and the dosage are set so that the impurities to be implanted do not penetrate through the poly silicon films 15a and 15b which are on the substrate surface. Thereby, the impurities do not reach the second poly silicon film 15b, so the impurity concentration of the second poly silicon 15b becomes lower than that of the first poly silicon film 15a.

The film thickness sufficient for gate electrodes of memory cell transistors and peripheral circuit transistors is provided when the second poly silicon film 15b is formed.

Figure 5C:
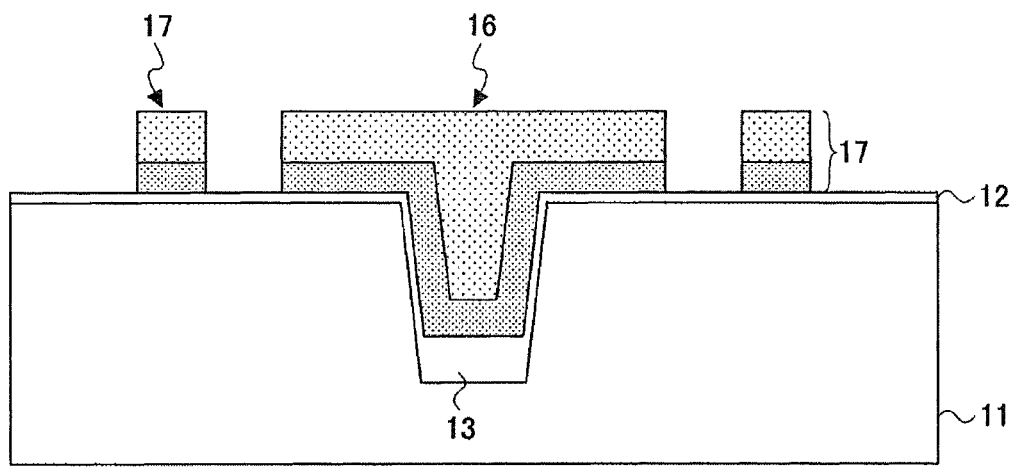
FIG. 5C shows another illustration for describing a basic configuration.

Next, as shown in FIG. 5C, the second poly silicon film 15b and the first poly silicon film 15a are processed into a predetermined shape, and a cell plate electrode 16 and gate electrodes 17 of memory cell transistors are formed.

Figure 5D:
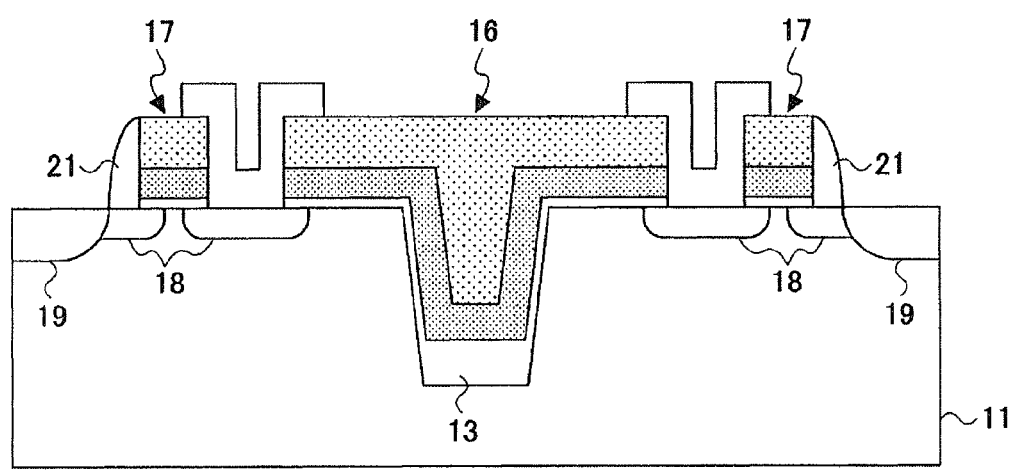
FIG. 5D shows another illustration for describing a basic configuration.

As shown in FIG. 5D, LDD impurity diffusion layers 18 are formed by using the gate electrodes 17 as a mask, and source-drain impurity diffusion layers 19 are formed by using the gate electrodes 17 and side wall insulating films 21 as masks.

Thereby, as the cell plate electrode 16 formed in the trench 14 for device isolation (STI) is affected by two configurations, i.e., different film thicknesses and impurity concentrations, a same predetermined film thickness for gate electrodes 17 of memory cell transistors and peripheral cell transistors (not shown), and depletion layer formation of the cell plate electrode 16 may be avoided. Further, plural types of resistor elements having different resistances may be formed with the formation of cell plate electrodes 16 and gate electrodes 17, as described below.

Figure 6:
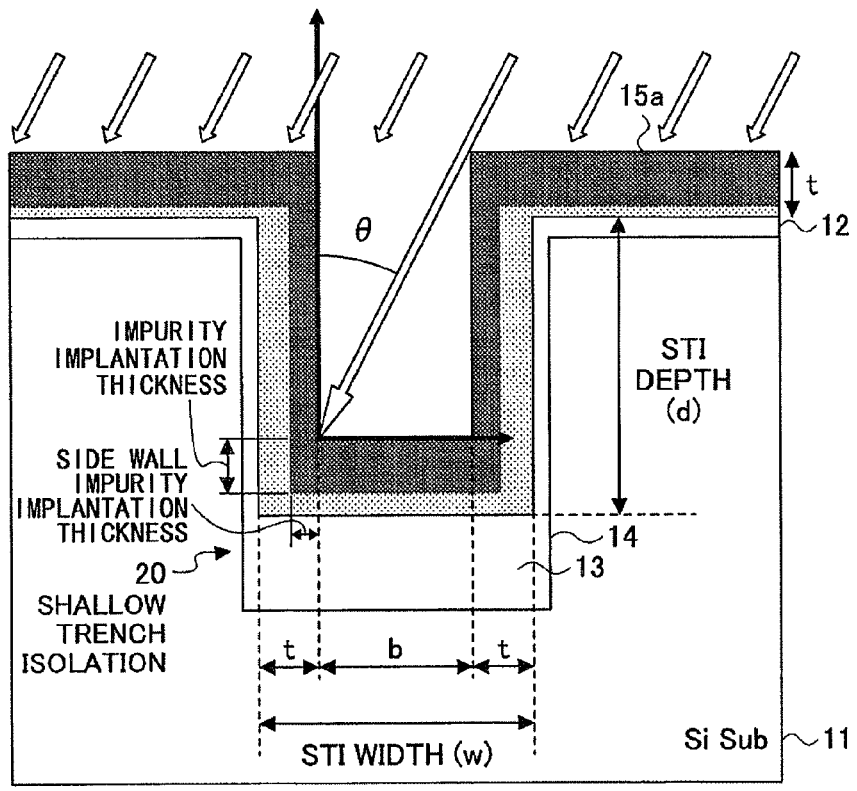
FIG. 6 is an illustration describing the setting angles of an impurity implantation.

FIG. 6 is an illustration for describing a method of setting an implantation angle θ (an oblique angle to the substrate 11 normal) when impurities are implanted into the first poly silicon film 15a. Assuming that the thickness of the first poly silicon film 15a is t and that the width of the device isolation region STI 20 is w, the width b (b =w−2t) is calculated by subtracting the film thickness of the first poly silicon film 15a covering the side wall from the width of STI 20.

When the depth of STI 20 (the distance from the substrate surface to the surface of the buried insulating film 13) is d, then the implantation angle θ is expressed by $$\theta < \tan^{-1}(b/d) = \tan^{-1}[(w-2t)/d].$$

For example, for STI 20 with w=0.06 μm, the depth d=0.25 μm, and the first poly silicon film 15a thickness t is 0.06 μm, then the implantation angle may be obtained as $$\theta < \tan^{-1}[(0.18-2\times0.06)/0.25] < 13.5°.$$

For STI 20 having a depth d of 0.35 μm, then the implantation angle may be obtained as $$\theta < \tan^{-1}[(0.18-2\times0.06)/0.35] < 9.74°.$$

At the substrate surface, the impurity implantation thickness of the first poly silicon film 15a along the implantation angle decreases with increasing the implantation angle θ, while the impurity implantation thickness of the first poly silicon film 15a along the implantation angle increases around the side walls (side wall impurity implantation thickness) of the trench 14. Therefore, as the impurities can be deeply implanted into the first poly silicon film 15a at the side wall of the trench 14, it becomes advantageous for reducing the depletion effect of the cell plate electrode 16.

Figure 7A:
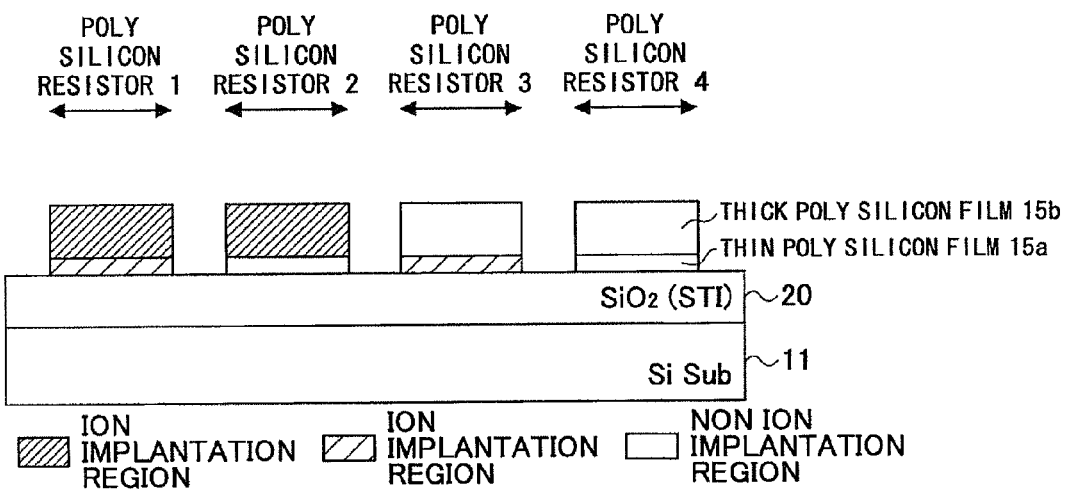
FIG. 7A is an illustration describing a fabrication method of plural types of resistor elements in a unit area.

FIG. 7A and FIG. 7B are schematic illustrations for describing the method of forming plural types of resistor elements with different resistances per unit area at the same time when the cell plate electrode 16 and the gate electrode 17 are formed as shown in FIG. 5A through FIG. 5D.

As indicated in FIG. 7B, by using a combination of ion implantation conditions, four types of resistor elements 1-4 with different resistances may be formed on the STI oxide 20 of the silicon substrate 11, as shown in FIG. 7A, wherein the options are performing or not performing implantation onto the first (thin film) poly silicon film 15a on the resistor element part and performing or not performing implantation onto the second (thick film) poly silicon film 15b.

Therefore, plural resistor elements may be obtained by combinations of presence or absence of the impurity implanted in the first poly silicon film and the presence or absence of an impurity implanted in the second poly silicon film.

FIG. 8A shows a plan view of a semiconductor memory device related to an embodiment. In this example, a memory cell having a 4-column by 2-row configuration is indicated. An active region (AR) of the cell is arranged to align the row, and a two-bit memory cell (MC) is formed by a single active region (AR). Further, for this layout, cell plate electrodes (CP) are commonly arranged to two memory cells (MC) on two columns.

Figure 8B:
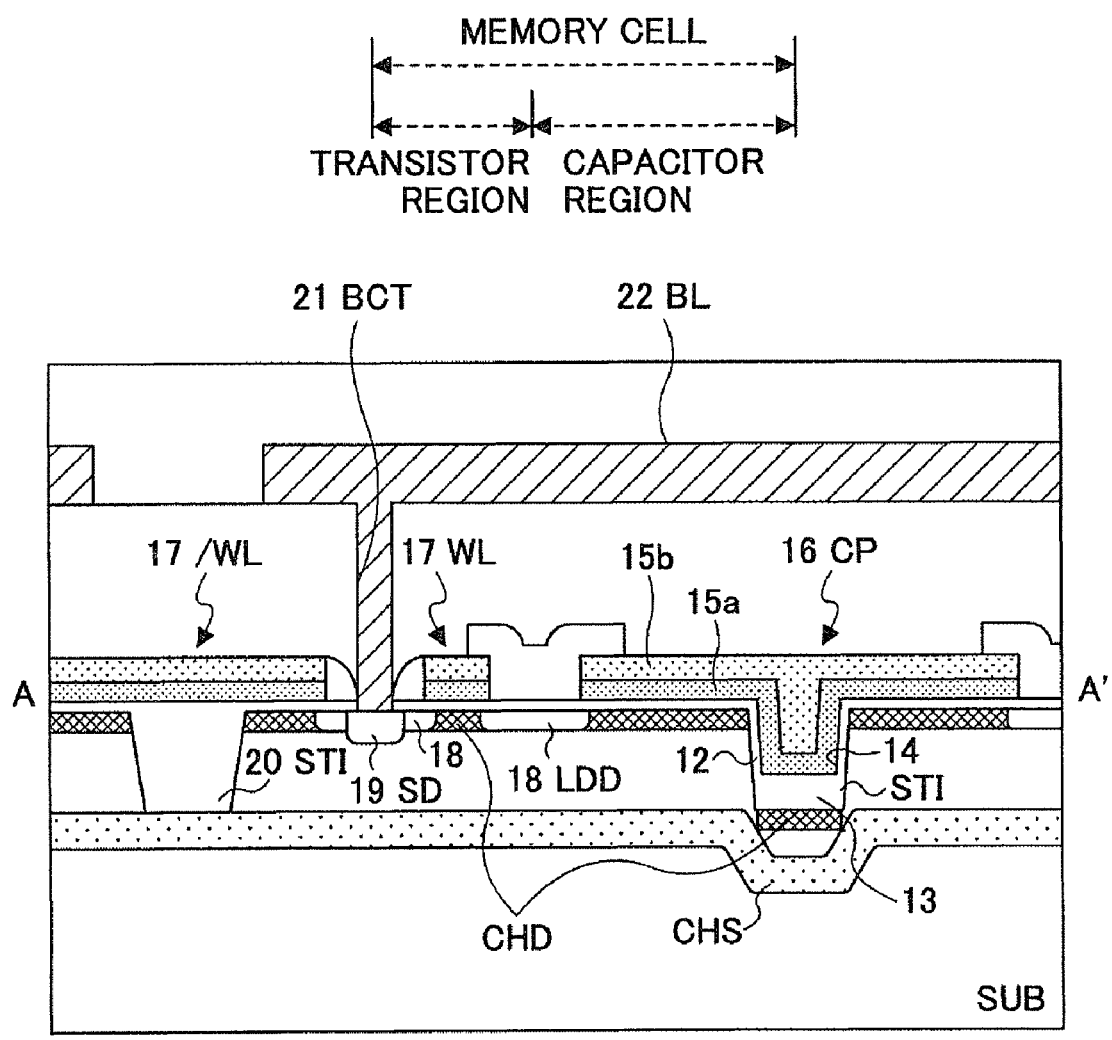
FIG. 8B shows a schematic illustration of a cross-sectional view along A-A' of FIG. 8A.

FIG. 8B shows a cross-sectional view of the memory cell along the line A-A' in FIG. 8A. The semiconductor memory device includes a cell plate electrode 16 formed on an insulating film 12 of the device isolation (STI) 20 side wall and a gate electrode (corresponding to a word line WL) 17 of a transistor.

The cell plate electrode 16 includes a first poly silicon film 15a partially filling the device insulation (STI) trench 14 and a second poly silicon film 15b adjusting the film thickness of the transistor gate electrode 17 to be a predetermined thickness, where the first poly silicon film 15a in the trench 14 includes a higher concentration of impurities than that of the second poly silicon film 15b.

When a bias voltage is applied to the cell plate electrode 16, the channel doped region (CHD) of the substrate surface (STI side wall including the substrate side) is inverted and forms an inversion layer, so that a capacitor structure is formed with the insulating film 12 and the cell plate electrode 16. The inversion layer is connected to a LDD diffusion region 18 which extends to one side of the gate electrode (or word line) 17 of the memory cell transistor. The source-drain diffusion region 19 of the transistor is connected to a bit line (BL) 22 through a bit line contact (BCT) 21. A memory cell including this transistor and this capacitor is isolated from adjacent cells by another device isolation trench (STI) 20. A channel stop layer (CHS) is located below the STI trenches 20.

As the cell plate 16 is formed with two layers and the impurity concentration of the first poly silicon film 15a is sufficient high, where the poly silicon film 15a is provided along the side wall of the trench 14, it becomes possible to prevent forming a depletion layer when bias is applied. Further, providing the second poly silicon film 15b allows providing a required film thickness for forming the gate electrode 17 of the transistor, and also maintaining sufficient implantation depth of the impurity diffusion layer for predetermined device operations.

FIG. 9A through FIG. 9M show a fabrication process of a semiconductor memory device related to an embodiment.

Figure 9A:
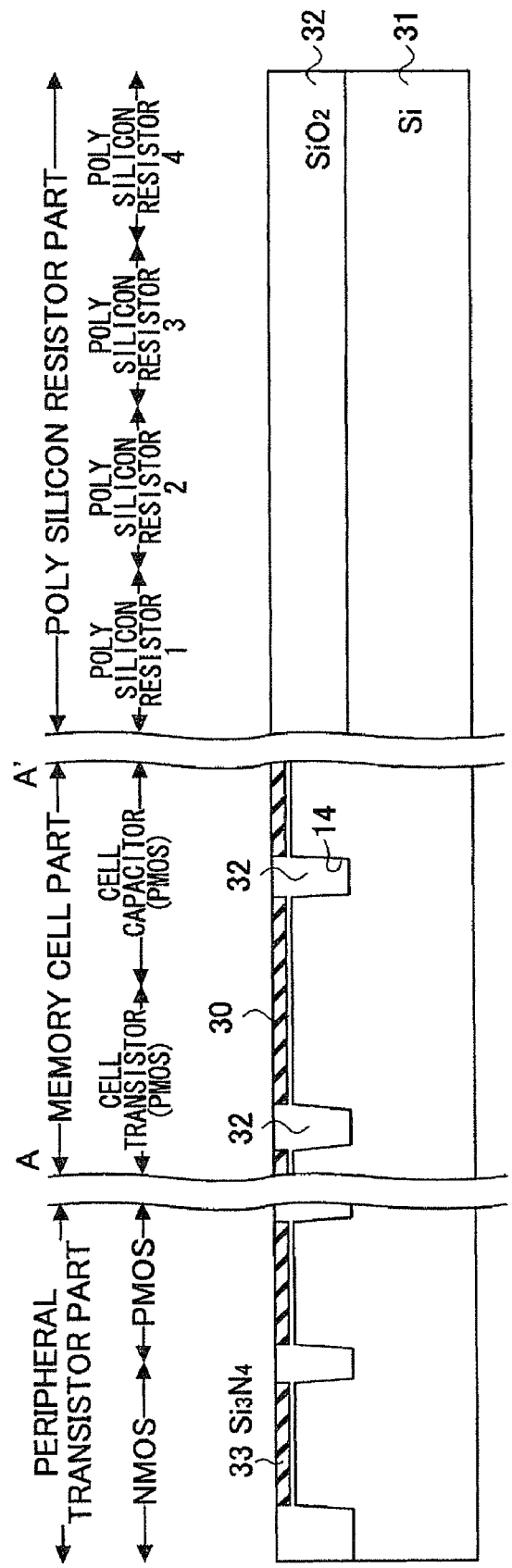
FIG. 9A shows a schematic illustration of a semiconductor memory device fabrication process related to an embodiment.

In FIG. 9A, as an example, a surface of a p-type silicon substrate 31 is oxidized to form an initial oxide film 30 and a silicon nitride film 33 on the oxide film 30. A resist pattern is formed to cover a peripheral transistor part and a memory cell part (not shown), and the silicon nitride film 33, the initial oxide film 30, and silicon substrate 31 are etched; the etching is followed by removal of the resist pattern. After the etching process, a trench 14 is formed at predetermined parts of a peripheral transistor region and a memory cell region. The etching depth of the silicon substrate 31 contributes to the capacitance of the memory cell region. The depth may be modified according to the device design. An example in FIG. 9A shows that approximately 300 nm of the silicon nitride film 33 is etched off from its surface. Next, a flattening process using a CMP technique is applied after covering the whole silicon substrate with a silicon dioxide film 32.

FIG. 9B indicates that a resist pattern (not shown) with an opening over the memory cell area is used to etch the corresponding part of the silicon dioxide film 32 of the device isolation (STI) about 250 nm thick, and approximately 50 nm of the silicon dioxide film 32B is retained on the bottom of the trench 14; this etching is followed by removal of the resist pattern.

Figure 9C:
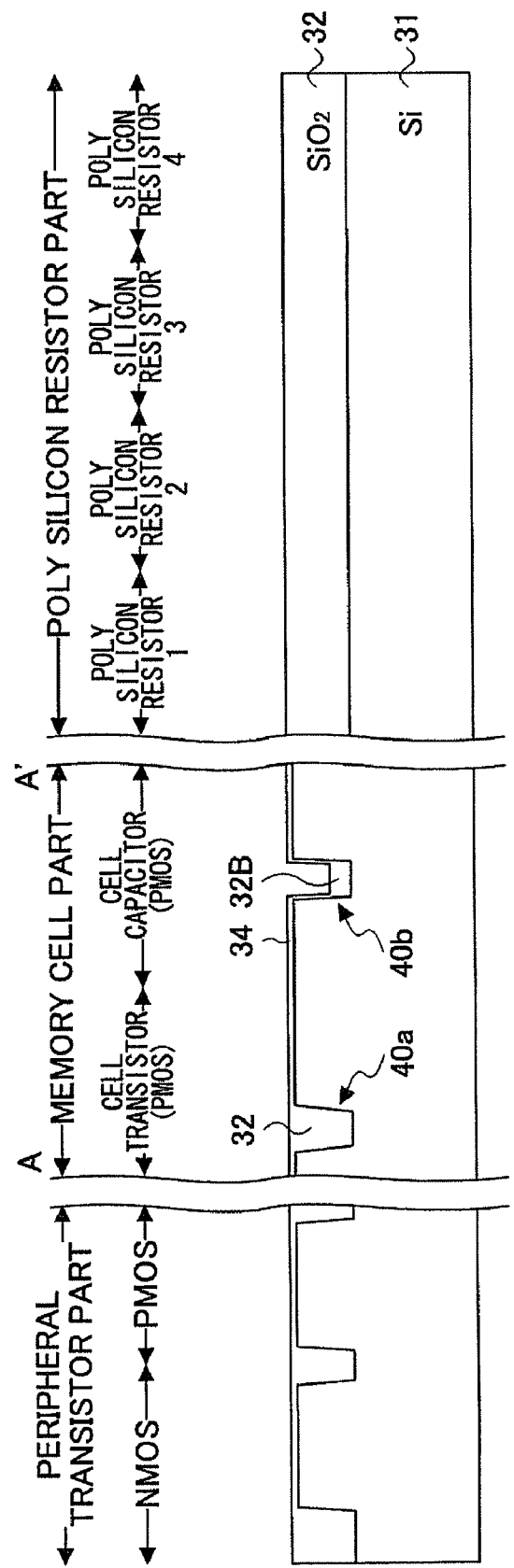
FIG. 9C shows a schematic illustration of a semiconductor memory device fabrication process related to another embodiment.

FIG. 9C indicates that the remaining silicon nitride film 33 and initial oxide film 30, which are unnecessary for the following process, are removed (wet etching) by using a solution of phosphoric acid or hydrogen fluoride (HF). As a result, a deep STI 40a and a shallow STI 40b are formed on the same substrate. In the following, a thick silicon dioxide film 34 10 nm in thickness is formed on the silicon substrate 31 as a protecting film for ion implantation to form the wells.

FIG. 9D shows that a resist pattern (not shown) is formed so that its openings correspond to PMOS regions of the memory cell part and the peripheral transistor part, and n-type impurities are implanted onto the resist pattern to form a n-type well (not shown). The implantation conditions are, for example, using phosphorus (P) at energy of approximately 600 keV with a dosage of approximately $3.0\times10^{13}$ cm$^{-2}$. Further, to increase the impurity concentration of the silicon substrate under the STI 40, a channel stop 36n is formed. For example, for this implantation condition, phosphorus (P) is used at energy of approximately 240 keV at a dosage of approximately $7.5\times10^{12}$ cm$^{-2}$. Further, arsenic (As) implantation is performed at energy of approximately 100 keV with a dosage of approximately $4.3\times10^{12}$ cm$^{-2}$ for forming a channel dose 37n to control the characteristics of PMOS transistors. For the channel dose conditions, the implantation conditions may be optimized to penetrate a buried silicon dioxide film 32B at the bottom of shallow STI 40b for improving the device isolation characteristics under the shallow STI 40b. The used resist pattern is removed after the process.

Likewise, a p-type well (not shown) is formed by well implantation using a resist pattern (not shown) to open an NMOS transistor region. The implantation conditions may be chosen by using boron (B) at energy of approximately 300 keV with a dosage of approximately $3.0 \times 10^{13}$ cm$^{-2}$. Further, a channel stop 36p is formed to increase the impurity concentration of the silicon substrate 31 under the STI region. For these implantation conditions, for example, boron (B) may be used at energy of approximately 100 keV with a dosage of approximately $8.0 \times 10^{12}$ cm$^{-2}$. After the implantation, the resist pattern is removed.

Figure 9E:
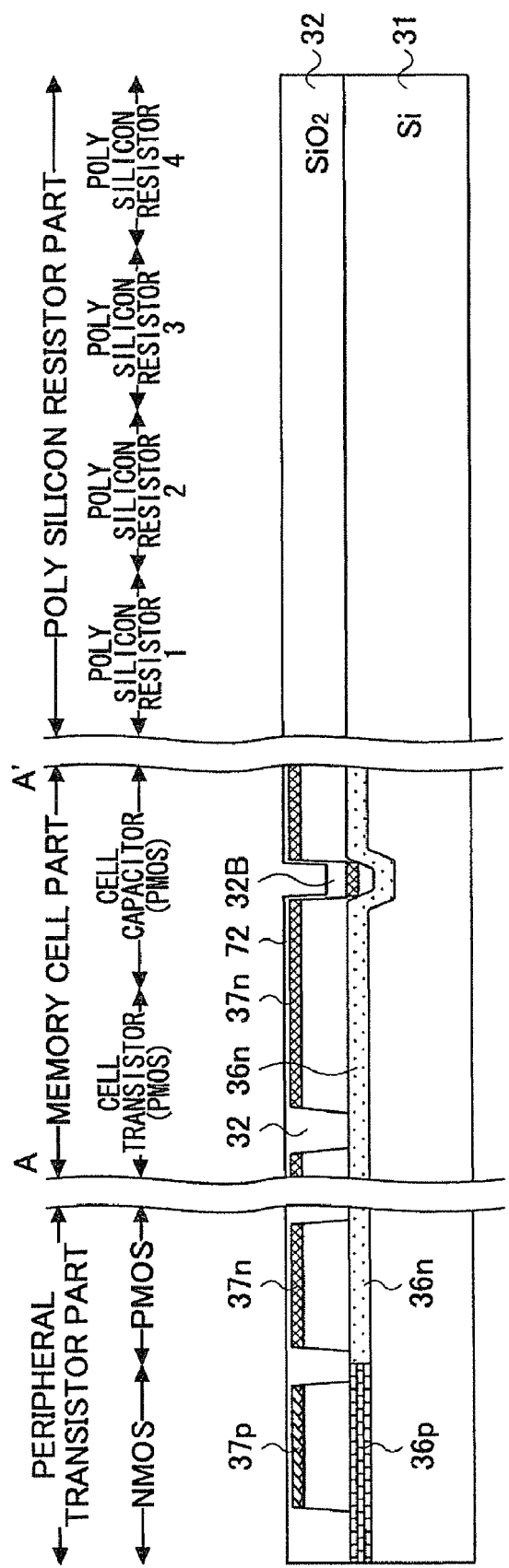
FIG. 9E shows a schematic illustration of a semiconductor memory device fabrication process related to another embodiment.

FIG. 9E shows that a silicon oxide film 34 is removed with a HF solution and the surface of the silicon substrate 31 is oxidized, so that a silicon oxide film 72 is grown with a thickness of approximately 2.3 nm. In this step, the formed oxide film 72 becomes a gate insulating film and an insulating film of a cell capacitor as well. In this example, although the gate insulating film region and the capacitor insulating film region of the cell capacitor have the same film thickness, the thicknesses of the gate insulating film of the transistor and the capacitor insulating film may bee made different by using the dual gate insulating film process.

Figure 9F:
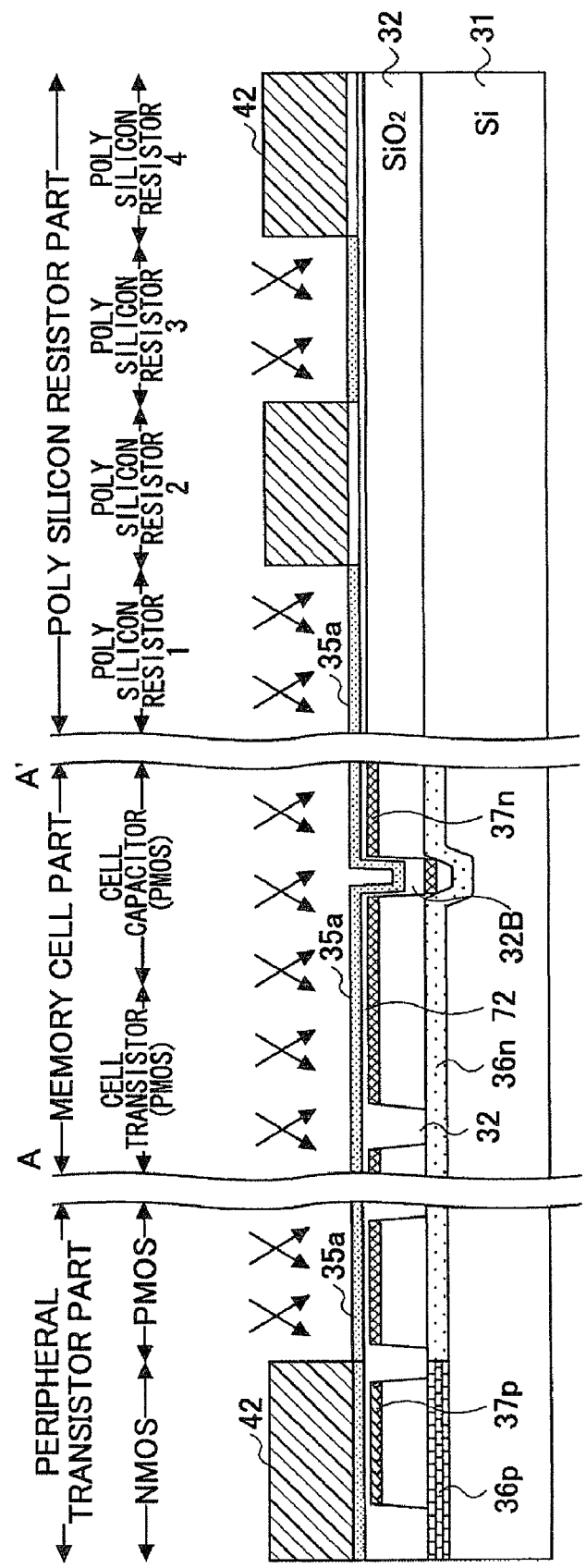
FIG. 9F shows a schematic illustration of a semiconductor memory device fabrication process related to another embodiment.

FIG. 9F shows that a first poly silicon film 35a approximately 60 nm in thickness is formed on the oxide film 72 to be used for the gate insulating film and the capacitor insulating film by using CVD method. This film thickness is designed to not completely fill the shallow STI 40b having the buried silicon dioxide film 32B at the bottom of the trench. After forming the first poly silicon film 35, ion implantation for impurity doping is performed onto the PMOS formation region in a peripheral transistor part, a memory cell part, and a predetermined poly silicon resistor element part (in this example, the part corresponds to the parts of the poly silicon resistor 1 and the poly silicon resistor 3) by using a resist pattern 42, where the openings of the resist pattern 42 expose the first poly silicon film 35. The implantation conditions are at energy of approximately 15 keV with a dosage of approximately $1.0 \times 10^{15}$ cm$^{-2}$ with boron fluoride (BF) from four angles with substrate rotation (the total dosage: $4.0 \times 10^{15}$ cm$^{-2}$). The implantation energy may be designed not to penetrate through the first poly silicon film 35a in the memory cell transistor formation region, and the implantation angle is in accordance with the sequence as described in FIG. 6. Although this example applies to a four-direction rotating implantation, the rotating implantation with plural times may be chosen according to the layout of a memory cell.

It becomes possible to form plural poly silicon resistors with different resistances without increasing the number of process steps when the parts being implanted or not implanted are predetermined in the area of the first poly silicon film 35a for the poly silicon resistor part. Further, an impurity implantation may be performed onto the first poly silicon film 35a of the NMOS transistor area by using another resist pattern (not shown).

Figure 9G:
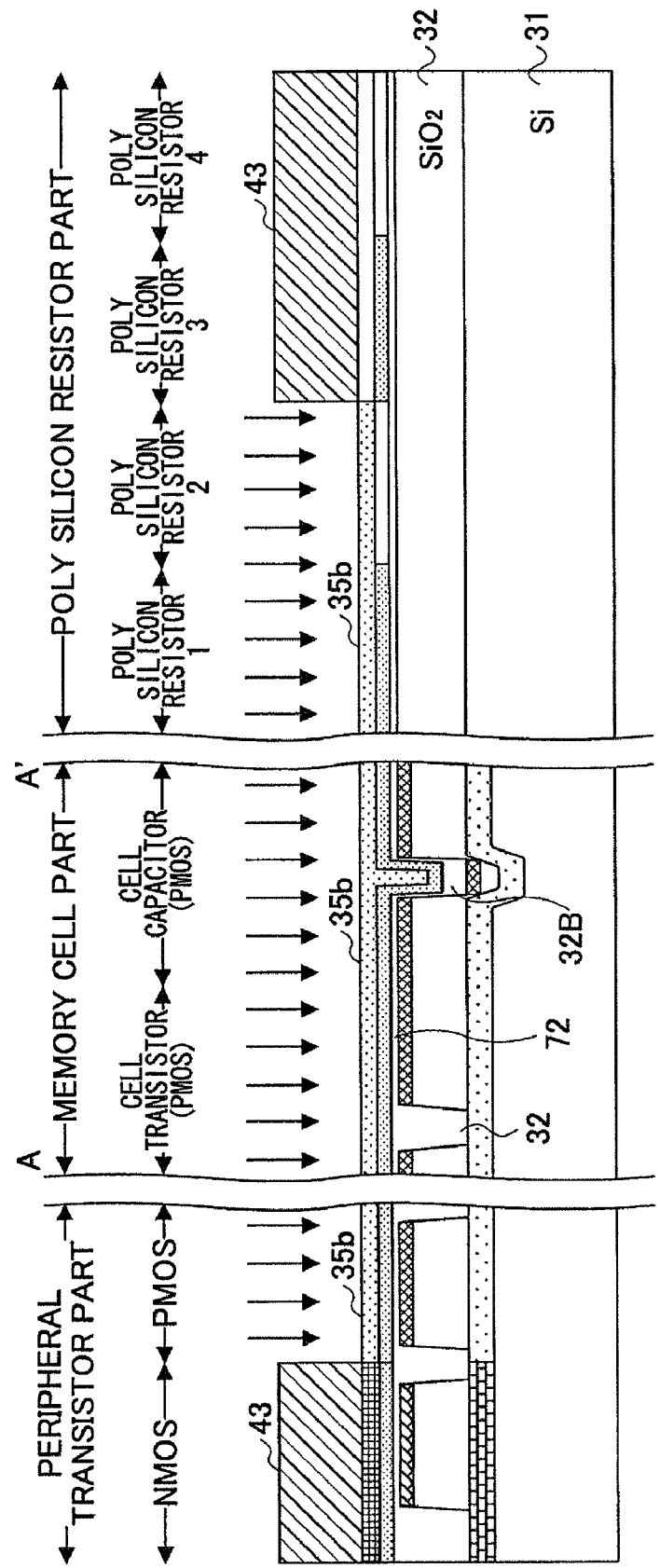
FIG. 9G shows a schematic illustration of a semiconductor memory device fabrication process related to another embodiment.

As indicated in FIG. 9G, after removing the resist pattern 42, a second poly silicon film 35b approximately 120 nm in thickness is formed on the first poly silicon film 35a by using the CVD method. The total film thickness of the first poly silicon film 35a and the second poly silicon film 35b becomes the gate electrode thickness of the transistor, and the ion implantation for source-drain diffusion may be performed in a self-alignment manner according to the total film thickness.

If necessary, as shown in the figure, by using the resist pattern 43, ion implantation for impurity introduction may be performed onto the second poly silicon film 35b of the PMOS formation region in the peripheral transistor part, the memory cell part, and the predetermined poly silicon resistor part (in this example, the area corresponds to the poly silicon resistor 1 and the poly silicon resistor 2). The implantation conditions are, for example, at approximately 18 keV with a dosage of approximately $6.0 \times 10^{15}$ cm$^{-2}$ using boron (B) applied normal to the substrate. The conditions of the implantation energy and the dosage may be chosen so that the impurities do not penetrate the gate electrode of the transistor. Thereby, the impurities may not reach the second poly silicon film 35b buried into the trench; as a result, the impurity concentration of the second poly silicon film 35b becomes less than that of the first poly silicon film 35a.

It becomes possible to form plural poly silicon resistors with different resistances by designing the implantation conditions for the poly silicon resistor formation region of the second poly silicon film 35b and the conditions of the ion implantation onto the first poly silicon film 35a.

Plural poly silicon resistor elements may be formed by combining the implantation conditions. The conditions may consist of four options, that is, performing or not performing impurity implantation onto a second poly silicon film 35b and performing or not performing ion implantation onto a first poly silicon film 35a. Further, using a resist pattern (not shown), impurity doping may be performed onto NMOS transistor region of the second poly silicon film 35b. The ion implantation onto the second poly silicon film 35b may be performed with the implantation for the source-drain diffusion layer formation, which will be described below.

Figure 9H:
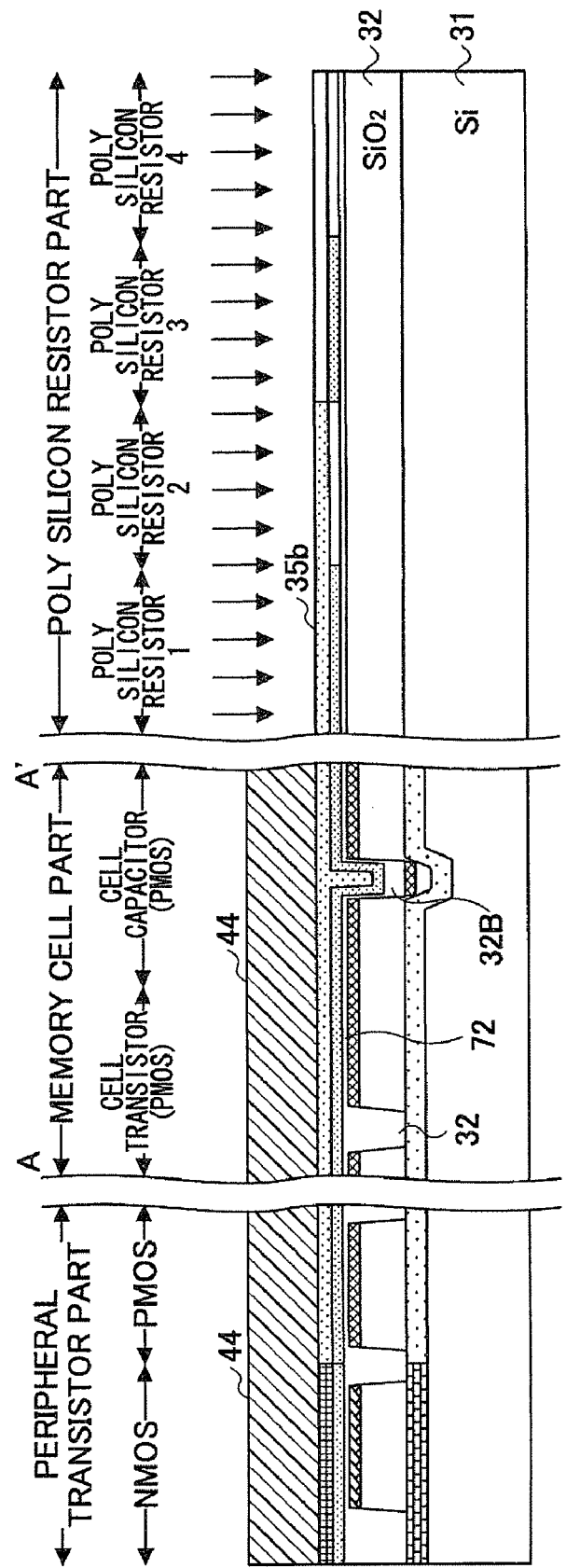
FIG. 9H shows a schematic illustration of a semiconductor memory device fabrication process related to another embodiment.

Further, if necessary, as shown in FIG. 9H, the impurity doping into the poly silicon resistor part may be performed using boron (B) at approximately 13 keV with a dosage of approximately $5.0 \times 10^{13}$ cm$^{-2}$ applied normal to the substrate using a resist pattern 44. The ion implantation into the second poly silicon film 35b is to adjust the resistance of the high resistance poly silicon. Therefore, if necessary, the implantation may be performed onto the PMOS transistor region or the memory cell region. The ion implantation for the adjustment of the resistance may be performed with the implantation for LDD diffusion layer formation, which is described below.

Figure 9I:
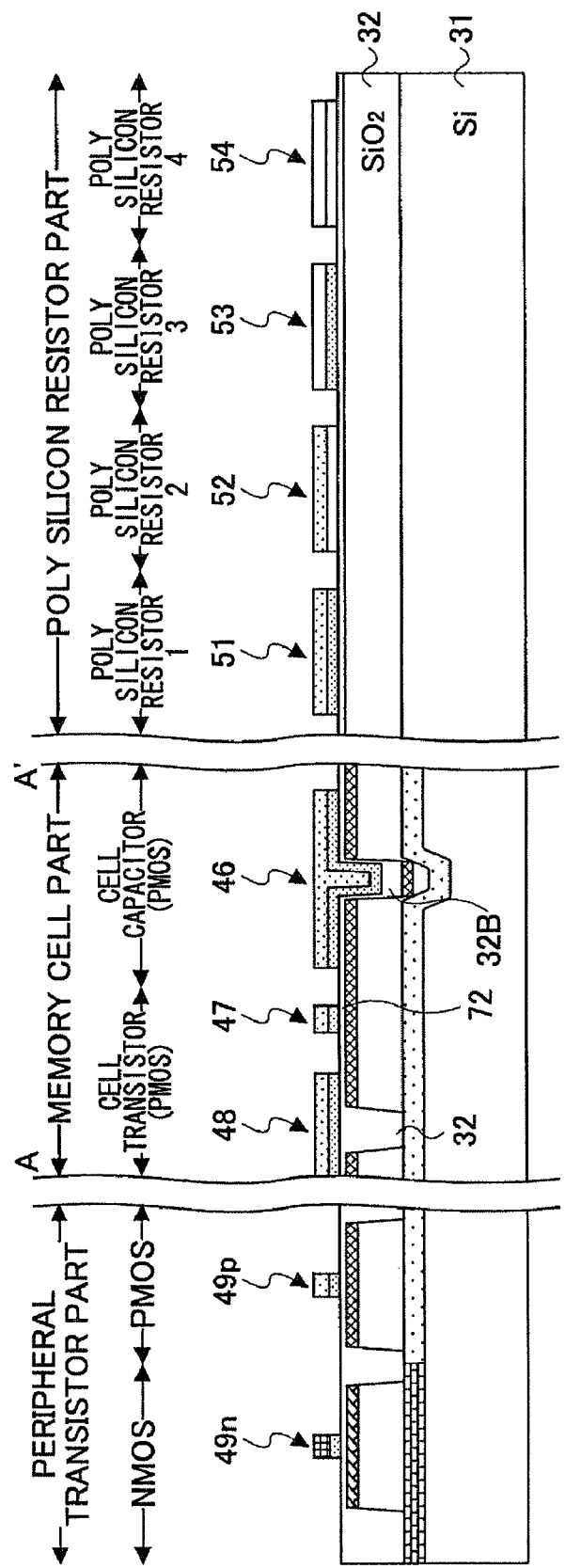
FIG. 9I shows a schematic illustration of a semiconductor memory device fabrication process related to another embodiment.

FIG. 9I shows that gate electrodes 49n and 49p of CMOS, the gate electrode 47 of the memory cell transistor, a base word line 48, a cell plate electrode 46 of the capacitor, and poly silicon resistors 51, 52, 53, and 54 are formed at the same time using a resist pattern (not shown).

Figure 9J:
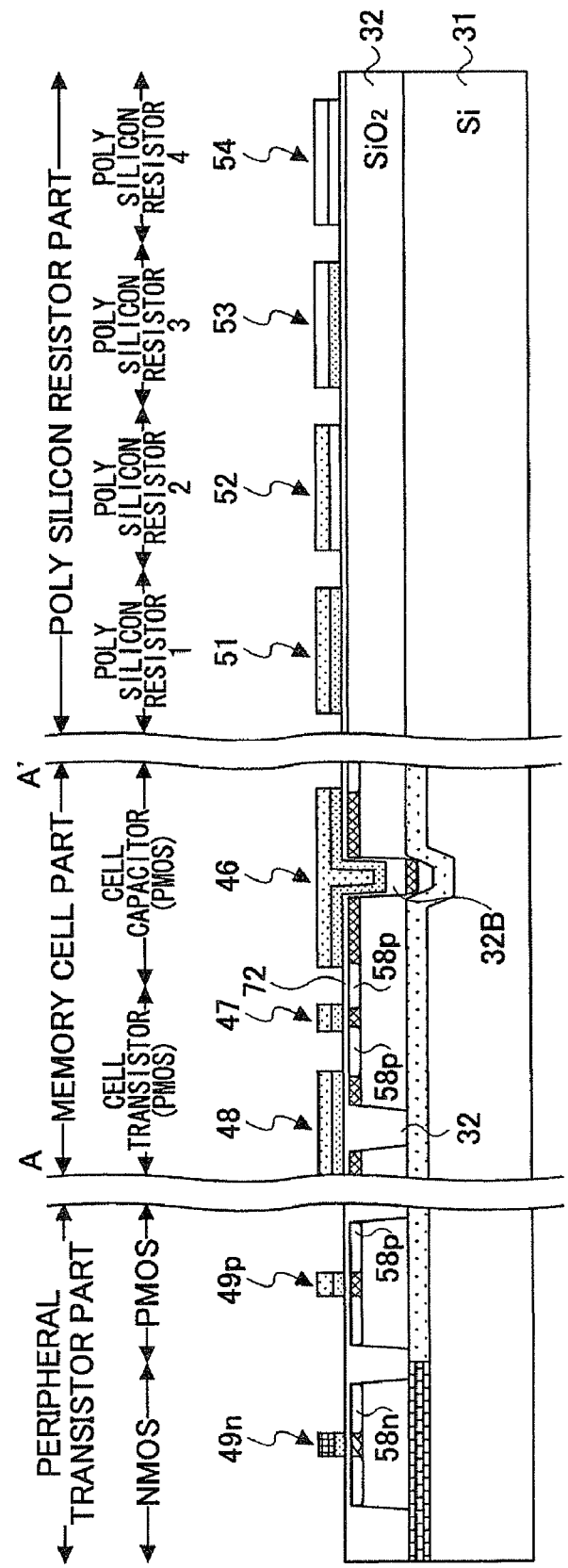
FIG. 9J shows a schematic illustration of a semiconductor memory device fabrication process related to another embodiment.

As shown in FIG. 9J, a resist pattern (not shown) is formed to open the memory part and PMOS transistor part, and a LDD diffusion layer 58p is formed by self-alignment ion implantation using the gate electrodes 49p, 47, 48 and the cell plate electrode 46 as masks. Specifically, after the ion implantation is performed with boron (B) at approximately 0.5 keV with a dosage of approximately $3.6 \times 10^{14}$ cm$^{-2}$, arsenic (As) is implanted as Halo ion implantation at approximately 80 keV with a total dosage of approximately $2.6 \times 10^{13}$ cm$^{-2}$ at an angle of approximately 28° with four-direction implantation. After the step, the resist pattern is removed. As the LDD/Halo implantation modifies the characteristics of the transistors, if necessary, the conditions of implantation including whether to perform the implantation may be chosen. Also, the boron implantation may be performed onto the poly silicon resistor part.

Likewise, a resist pattern (not shown) is formed to open the NMOS transistor formation region, and using the gate electrode 49n as a mask, the LDD diffusion layer 58n is formed by the self-alignment method. Specifically, after arsenic (As) is implanted at approximately 3.0 keV with a dosage of approximately $1.1\times10^{15}$ cm$^{-2}$, boron fluoride (BF) is implanted as the Halo ion implantation at approximately 35 keV with a total dosage of $3.3\times10^{13}$ cm$^{-2}$ at an angle of approximately 28° with four-direction implantation. After the process, the resist pattern is removed. As the LDD/Halo implantation modifies the characteristics of the transistor, the implantation conditions or whether to perform implantation may be chosen as necessary.

After ion implantation, RTA may be performed to activate impurities and to minimize the transition diffusion of the impurity.

Figure 9K:
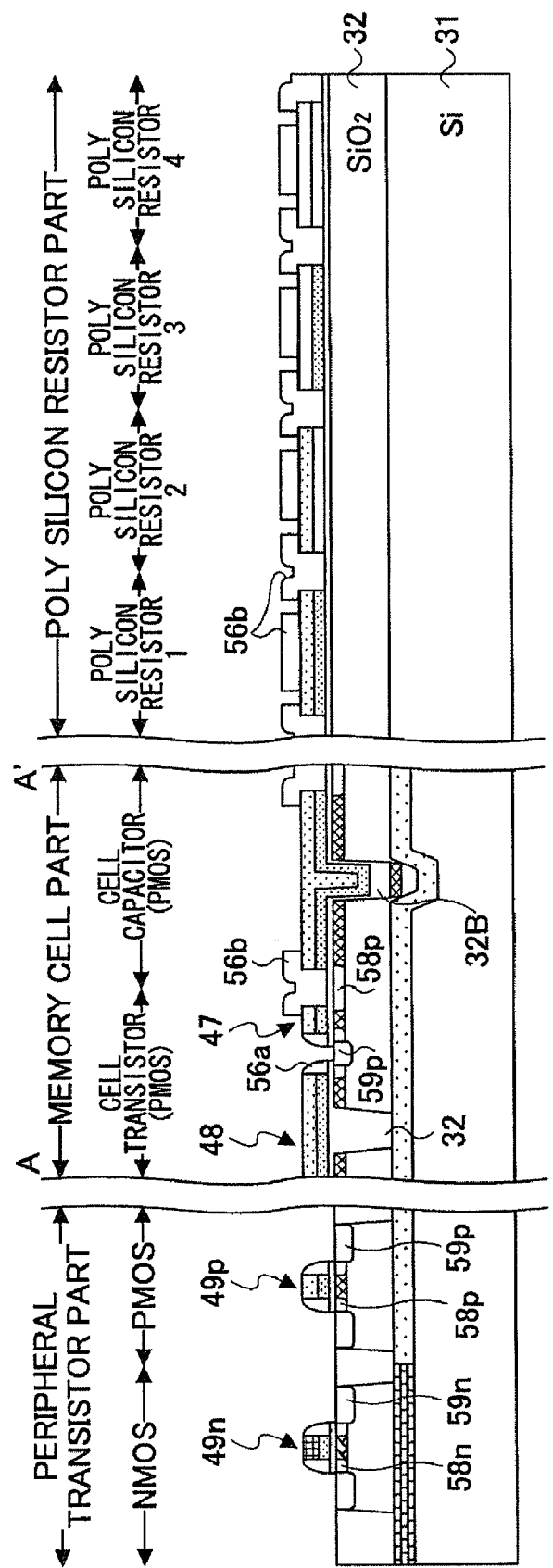
FIG. 9K shows a schematic illustration of a semiconductor memory device fabrication process related to another embodiment.

FIG. 9K shows that a side wall oxide film approximately 130 nm in thickness is formed by using a CVD method, the necessary part is opened with the resist pattern (not shown), and side wall spacers 56a and 56b are formed at the necessary part by using an anisotropic etching method. In this example, although the side wall spacers are retained between the gate electrode and the cell plate electrode, anisotropic etching may be performed for a side wall spacer at the bit line contact. Further, although this example shows that the side wall oxide on the cell plate electrode is etched, the oxide film may not be etched. Whether to etch the side wall oxide film may be decided according to the plan. After the step, the resist pattern is removed.

A resist pattern (not shown) is formed so that the memory cell part and the PMOS transistor formation region are opened, and electrodes 49p, 47, 48, and the side wall spacer 56a are used as masks for a forming source-drain diffusion layer 59p, where boron (B) is implanted at approximately 5 keV with a dosage of approximately $4.0\times10^{15}$ cm$^{-2}$. At this step of the implantation, ions (B) are implanted onto the electrodes 49p, 47 and 48, as well. If necessary, the ion implantation may be performed onto the poly silicon resistor part. After that, the resist pattern is removed.

A resist pattern (not shown) is formed so that the NMOS transistor formation region is opened, and arsenic (As) is implanted at approximately 5 keV with a dosage of approximately $4.0\times10^{15}$ cm$^{-2}$ by using the gate electrode 49n and the side wall spacer 56a as a mask for forming a source-drain diffusion layer 59n. At the implantation step, As is implanted onto the gate electrode 49n as well. The resist pattern is removed after the step.

After the ion implantation, a RTA step is performed at approximately 1025° C. for about 3 seconds for activating the impurities and reducing transition diffusion of the impurities. Further, by using a CVD method, a CoSi film (not shown) is formed and treated by thermal annealing so that silicide films are formed on the gate electrodes 49n, 49p, 47, 48, source-drain diffusion layers 59n, 59p, and the poly silicon resistor. The rest of unnecessary parts of the CoSi film is removed.

As shown in FIG. 9L, an interlayer insulating film of wiring layers 61 is formed by a CVD method, and a resist pattern (not shown) is used for etching the interlayer insulating film of the wiring layers 61, so that a contact hole 62 is formed. After this step, the resist pattern is removed.

Figure 9M:
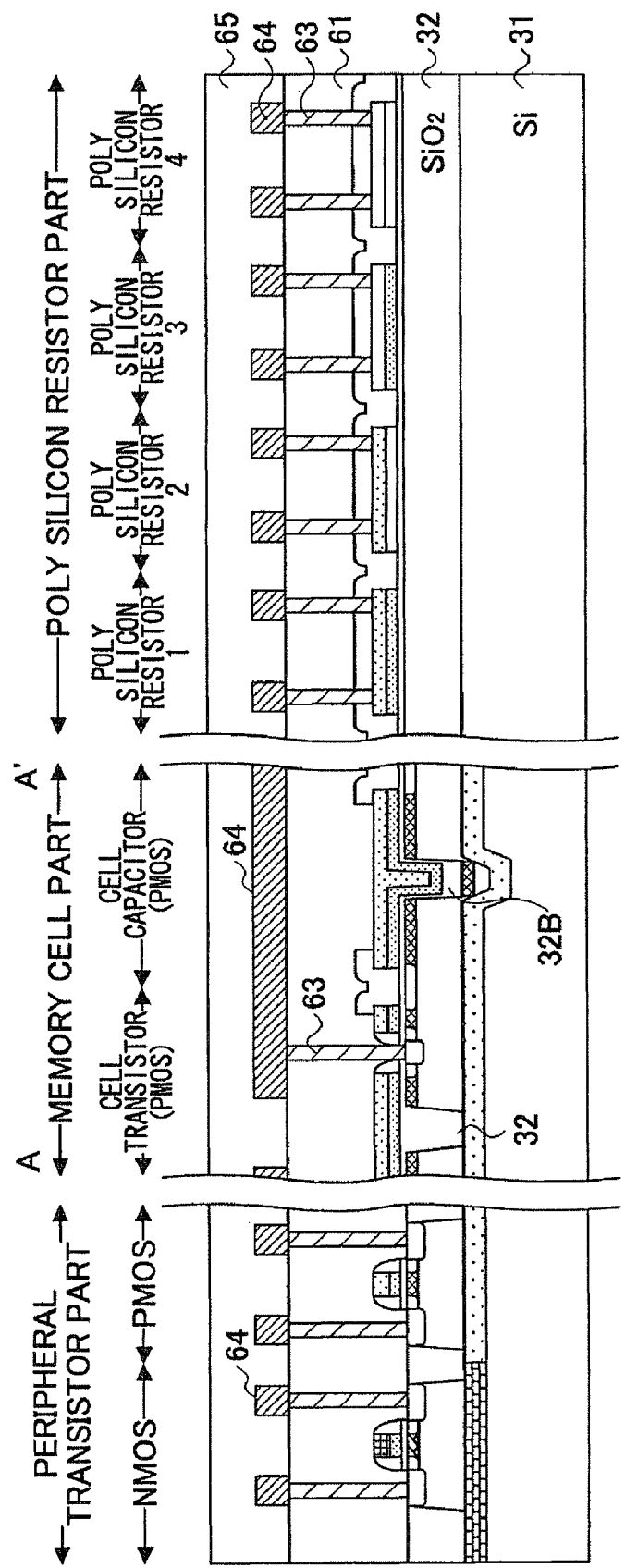
FIG. 9M shows a schematic illustration of a semiconductor memory device fabrication process related to another embodiment.

FIG. 9M shows that the contact hole 62 is filled with a conductor material, such as tungsten (W) through a glue layer (not shown), and the surface is finished by a CMP flattening method. A metallic film is deposited on the whole surface, and a predetermined shape is obtained by an etching process using a resist pattern (not shown), then metallic wire 64 is formed. The interlayer insulating film of wiring layers 65 is formed by removing the resist pattern. Further, a contact plug may be formed to contact an upper wiring if necessary.

For an embodiment of FIG. 9, although a p-type impurity is used for the memory cell transistor and poly silicon resistor, an n-type impurity may be used or both p-type and n-type may be used.

FIG. 10A is a schematic illustration for describing an effect of this embodiment. The illustration shows a two dimensional distribution of impurities obtained by a simulation result after the impurity (boron) is introduced into the poly silicon film formed in a trench. FIG. 10B is the simulation data corresponding to FIG. 10A. In FIG. 10A, fine lines indicate contours of the concentrations.

For comparison, FIG. 10A(a) and FIG. 10B(a) show the simulation results, where the impurity introduction is performed under a shallow condition. FIG. 10A(b) and FIG. 10B(b) show the simulation results for comparison, where the impurity introduction is performed under a deep condition. FIG. 10A(c) and FIG. 10B(c) show the simulation results, in which the poly silicon films (60 nm+120 nm) are deposited by two steps for controlling the impurity introduction, where the simulation conditions are similar to the present embodiment.

FIG. 10A(a) and FIG. 10B(a) indicate that the impurity introduction condition is shallow, in which the procedure is:
 a poly silicon film of approximately 180 nm in thickness is formed;
 boron (B) is implanted at approximately 18 keV with a dosage of approximately $4.0\times10^{15}$ cm$^{-2}$ normal to the substrate;
 boron (B) is implanted at approximately 18 keV with a dosage of approximately $6.0\times10^{15}$ cm$^{-2}$ normal to the substrate.

FIG. 10A(b) and FIG. 10B(b) indicate that the impurity introduction condition is deep, in which the procedure is:
 a poly silicon film of approximately 180 nm in thickness is formed;
 boron (B) is implanted at approximately 40 keV with a dosage of approximately $4.0\times10^{15}$ cm$^{-2}$ normal to the substrate;
 boron (B) is implanted at approximately 18 keV with a dosage of approximately $6.0\times10^{15}$ cm$^{-2}$ normal to the substrate;

FIG. 10A(c) and FIG. 10B(c) indicate the improved conditions according to the embodiment, in which the procedure is:
 a first poly silicon film of approximately 60 nm in thickness is formed;
 boron fluoride (BF$_2$) is implanted onto the first poly silicon film at approximately 15 keV with a dosage of approximately $1.0\times10^{15}$ cm$^{-2}$ at an oblique angle of approximately 13° to the substrate normal with four direction implantation (total dosage: $4.0\times10^{15}$ cm$^{-2}$);
 a second poly silicon film of approximately 120 nm in thickness is formed;
 boron (B) is implanted onto the second poly silicon film at approximately 18 keV with a dosage of approximately $6.0\times10^{15}$ cm$^{-2}$ normal to the substrate.

For FIG. 10A(a) and FIG. 10B(a), as the doped impurities do not reach the poly silicon film, depletion takes place in the cell plate when a bias is applied. For FIG. 10A(b) and FIG. 10B(b), the impurities penetrate to the lower part of the source-drain diffusion region, and a leakage current may occur.

For the conditions of FIG. 10A(c) and FIG. 10B(c) the first poly silicon film 15a includes a high concentration of impurities and is formed along the side wall of the trench. As the second poly silicon film, having lower impurity concentration than that of the first poly silicon film, is formed on the first poly silicon film so that the second poly silicon film fills the trench, it is possible to reduce the degradation of data retention characteristics which is caused by impurities not reaching the trench side wall, and it is possible to attenuate the increase in leakage current due to lack of impurity penetration.

In FIG. 10A and FIG. 10B, a particular range of the impurity concentration ($1.0 \times 10^{15}$ cm$^{-3}$–$3.0 \times 10^{21}$ cm$^{-3}$) is colored or hatched. Other ranges of impurity concentration are uncolored.

FIG. 11A is an illustration to show an effect of the embodiment, where an impurity (boron) is doped into the poly silicon film formed in a trench. The two dimensional impurity distribution profile after the final thermal treatment is shown. FIG. 11B shows the simulation data corresponding to FIG. 11A. The fine lines indicate the contours of the impurity concentration.

For comparison, FIG. 11A(a) and FIG. 11B(a) show the simulation results in which the impurity is doped in a shallow region. FIG. 11A(b) and FIG. 11B(b) show the simulation results in which the impurity is doped in a deep region. FIG. 11A(c) and FIG. 11B(c) show the simulation results in which poly silicon films (60 nm+120 nm) are formed by two steps according to the embodiment to control the impurity doping. In addition to the conditions of FIG. 10A(a)-FIG. 10A(c) and FIG. 10B(a)-FIG. 10B(c), SD implantation is performed by using boron (B) at approximately 5 keV with a dosage of approximately $4.0 \times 10^{15}$ cm$^{-2}$ normal to the substrate.

For FIG. 11A(a) and FIG. 11B(a), the depletion layer is expanded in the whole inside of the trench when a bias is applied to the cell plate electrode, then the depletion layer of the capacitor becomes wider, so that sufficient capacitance is not obtained relative to a predetermined capacitance. In the case of FIG. 11A(b) and FIG. 11B(b), the depletion layer is expanded to the center of the trench and considerable impurity penetration to the substrate side is seen in the figures. On the other hand, FIG. 11A(c) and FIG. 11B(c) indicating the embodiment show that the depletion layer is sufficiently narrow, and the depletion layer is formed along the side wall of the trench, so that sufficient capacitance can be obtained and the impurity penetration to the substrate is reduced.

Figure 12:
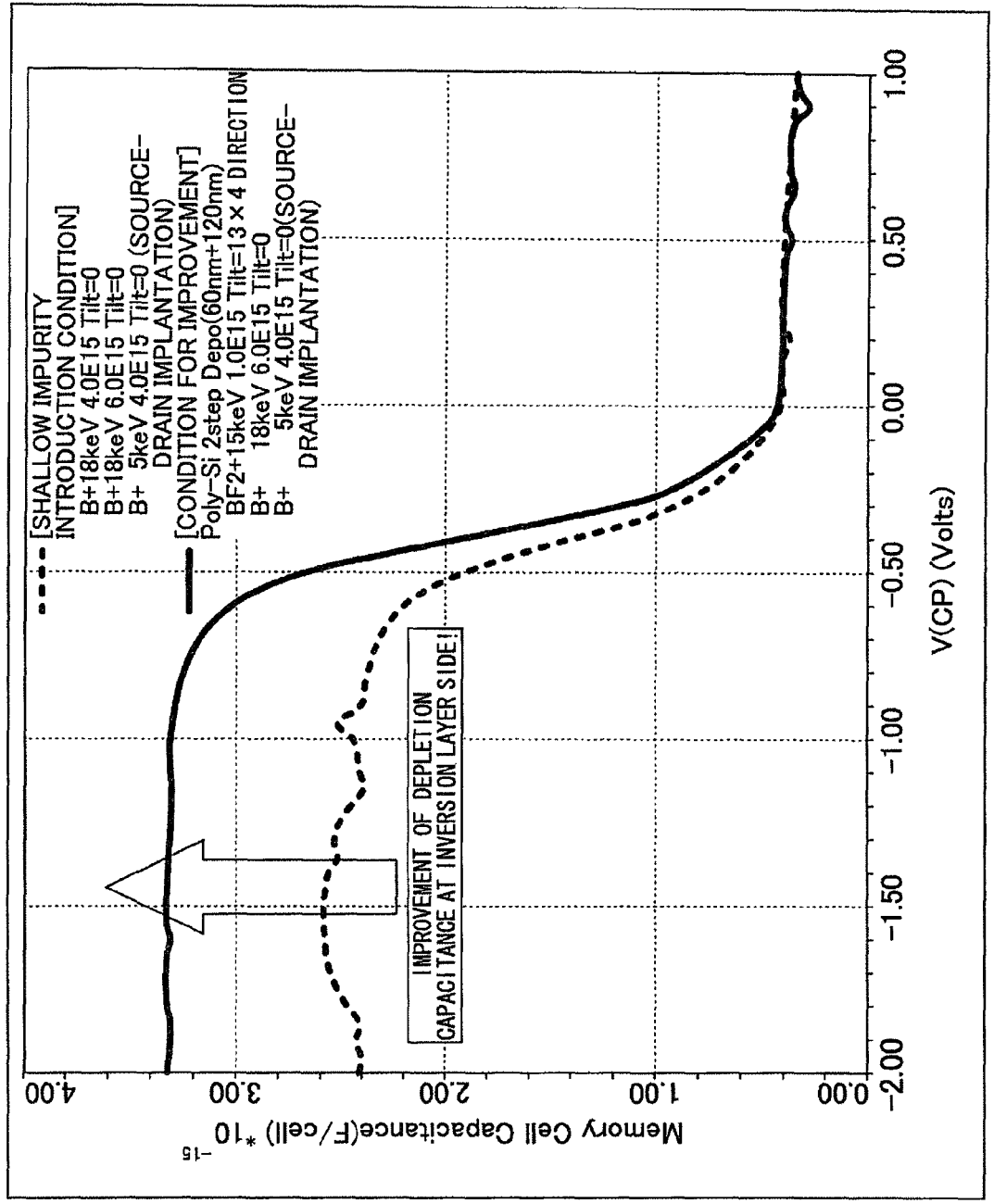
FIG. 12 shows a graph indicating an improved depletion effect related to the present invention.

FIG. 12 shows the effect of the embodiment for a semiconductor memory device. Two profiles are shown for comparison, in which a solid line indicates a CV characteristic of the semiconductor memory device according to the embodiment and a broken line indicates that of a conventional semiconductor memory device having impurity profile under a shallow implant condition. In the graphs, as an effect, it is seen that the effective capacitance is improved for the semiconductor memory device of the embodiment when a bias is applied to the cell plate electrode.

FIG. 13(a) shows a table of the ion implantation conditions according to the steps shown in FIGS. 9A-9M for forming resistors with a memory cell on the same substrate. FIG. 13(b) shows graphs of resistances of individual resistor elements. There are four combinations provided by combining process conditions, where the conditions consist of options, that is, with/without ion implantation for a thin poly silicon film (first poly silicon film) and a thick poly silicon film (second poly silicon film) respectively. Further, in this case, additional ion implantation for adjusting the resistance of a high resistor element is performed after the ion implantation onto the thick poly silicon film. This method allows providing four different resistor elements with different resistances during the process of a memory cell capacitor and transistor fabrication. Therefore, this method minimizes the increase of a layout area for resistor elements formation compared to the conventional process, where plural resistor elements are connected in series or parallel to fabricate a single resistor element.

As described above, a semiconductor device related to the embodiment includes, on a single substrate, a dual gate CMOS transistor with different conducting types of gate electrodes, a trench capacitor type memory cell, a cell plate electrode of the capacitor consisting of two layers, where the impurity concentration of the first poly silicon layer is designed to be higher than that of the second poly silicon layer, which first poly silicon layer is closer to the substrate. According to the configuration above, the depletion in the cell plate electrode is sufficiently reduced and stable capacitance is obtained. Further, a sufficient film thickness is provided for the dual gate electrodes of CMOS transistor for device reliability.

Further, the layout area may be reduced as plural types of resistor elements with different resistances can be provided on a single substrate.

For the semiconductor device fabrication process related to the embodiment, a first poly silicon film is formed to cover the whole surface of the semiconductor substrate, wherein the film does not completely fill the trench at this stage. Next, high concentrate impurity (first impurity) may be doped in the first poly silicon film by implanting a first impurity onto a first part of the first poly silicon film by energy for preventing the first impurity penetrating to the surface of the semiconductor substrate.

If necessary, a second impurity may be doped by a step of implanting the second impurity onto a second part of the first poly silicon film to obtain a conducting type different from the first part of the first poly silicon film by energy for preventing the second impurity penetrating to the surface of the semiconductor substrate.

A second poly silicon film is formed to cover the whole surface, and predetermined shapes are formed by patterning so that a cell plate electrode of a memory cell capacitor and gate electrodes of dual CMOS transistors are formed simultaneously.

This method prevents depletion in a cell plate electrode and impurity penetration into the substrate, so that sufficient and stable capacitance may be obtained. Sufficient film thickness of the gate electrodes of CMOS transistors is provided for required operation characteristics.

Further, if necessary, impurities may be implanted onto the predetermined part of the second poly silicon film, and plural types of resistor elements having different resistances, the cell plate electrode of a memory cell capacitor, and gate electrodes of dual CMOS transistors are formed simultaneously by patterning the first and second poly silicon films with predetermined shapes.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teachings herein set forth.

What is claimed is:
1. A semiconductor device comprising:
  a CMOS transistor having gate electrodes with different conducting types on a substrate;
  a trench capacitor type memory on a same substrate with the CMOS transistor; and
  a trench of the substrate for the trench capacitor including a dielectric film formed in the trench, a first poly silicon film formed inside of the trench, and a cell plate electrode located above the dielectric film;

wherein the cell plate electrode includes the first poly silicon film formed on the dielectric film to not completely fill the trench, and a second poly silicon film formed on the first poly silicon film to completely fill the trench;

wherein the second poly silicon film has a film thickness for forming the gate electrodes and the first poly silicon film;

wherein an impurity concentration of the first poly silicon film in the trench of the cell plate electrode is higher than an impurity concentration of the second poly silicon film filled inside of trench of the cell plate electrode.

2. The semiconductor device as claimed in claim 1, further comprising:

plural resistor elements having different resistances;

wherein the resistor elements include the first poly silicon film and the second poly silicon film, wherein the different resistances are obtained by combinations of presence or absence of the impurity doped in the first poly silicon film and the presence or absence of the impurity doped in the second poly silicon film.

3. The semiconductor device as claimed in claim 1, wherein the first poly silicon film of one of the gate electrodes of the CMOS transistor includes a same conducting type of the impurity as the conducting type of the impurity included in the first poly silicon film of the cell plate electrode.

4. The semiconductor device as claimed in claim 1, wherein the first poly silicon film of one of the gate electrodes of the CMOS transistors includes a conducting type of the impurity included in the first poly silicon film of the cell plate electrode.

* * * * *